(12) United States Patent
Yeh et al.

(10) Patent No.: US 8,802,561 B1
(45) Date of Patent: Aug. 12, 2014

(54) METHOD OF INHIBITING WIRE COLLAPSE

(71) Applicant: SanDisk 3D LLC, Milpitas, CA (US)

(72) Inventors: Chao Feng Yeh, Yokkaichi (JP); Hiroaki Iuchi, Nagoya (JP); Hitomi Fujimoto, Yokkaichi (JP); Hisayuki Nozawa, Yokkaichi (JP)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/862,222

(22) Filed: Apr. 12, 2013

(51) Int. Cl.
*H01L 21/4763* (2006.01)

(52) U.S. Cl.
USPC .......... 438/634; 438/622; 438/626; 438/631; 438/633; 438/697; 257/5; 257/E21.576; 257/E21.58; 257/E21.585

(58) Field of Classification Search
None
See application file for complete search history.

(56) References Cited

U.S. PATENT DOCUMENTS

| | | | | |
|---|---|---|---|---|
| 5,956,618 A | * | 9/1999 | Liu et al. | 438/183 |
| 6,287,972 B1 | * | 9/2001 | Ziger et al. | 438/693 |
| 6,395,639 B1 | * | 5/2002 | Esry et al. | 438/706 |
| 6,627,529 B2 | * | 9/2003 | Ireland | 438/619 |
| 7,285,464 B2 | * | 10/2007 | Herner et al. | 438/258 |
| 7,422,985 B2 | * | 9/2008 | Dunton et al. | 438/740 |
| 7,521,353 B2 | * | 4/2009 | Petti | 438/623 |
| 7,638,382 B2 | * | 12/2009 | Murooka et al. | 438/197 |
| 7,799,702 B1 | * | 9/2010 | Tanaka | 438/758 |
| 8,008,187 B2 | * | 8/2011 | Dunton et al. | 438/634 |
| 8,274,068 B2 | | 9/2012 | Nagashima | |
| 8,471,319 B2 | * | 6/2013 | Matsuo et al. | 257/296 |
| 2003/0057457 A1 | * | 3/2003 | Yamada et al. | 257/249 |
| 2009/0261315 A1 | * | 10/2009 | Toda et al. | 257/5 |
| 2010/0038617 A1 | * | 2/2010 | Nakajima et al. | 257/2 |
| 2010/0237311 A1 | * | 9/2010 | Okajima | 257/2 |
| 2011/0049465 A1 | | 3/2011 | Nagashima | |
| 2011/0069524 A1 | | 3/2011 | Toba et al. | |
| 2012/0126306 A1 | * | 5/2012 | Kawaguchi et al. | 257/319 |
| 2012/0236664 A1 | | 9/2012 | Kamoshia | |

* cited by examiner

*Primary Examiner* — Zandra Smith
*Assistant Examiner* — Khanh Duong
(74) *Attorney, Agent, or Firm* — Vierra Magen Marcus LLP

(57) ABSTRACT

Techniques disclosed herein prevent wire flaking (collapse). One aspect is an improved way of forming wires over trenches, which may be located in a hookup region of a 3D memory array, and may be used to form electrical connections between conductive lines in the memory array and drivers. The trenches are formed between CMP dummy structures. The trenches are partially filled with a flowable oxide film, which leaves a gap in the trench that is at least as wide as the total pitch of the wires to be formed. A capping layer is formed over the flowable film. After forming a conductive layer over the dielectric layer, the conductive layer is etched to form conductive wires. Some of the capping layer, as well as the CMP dummy structures may be removed. Thus, the conductive wires may be at least temporarily supported by lines of material formed from the capping layer.

20 Claims, 19 Drawing Sheets

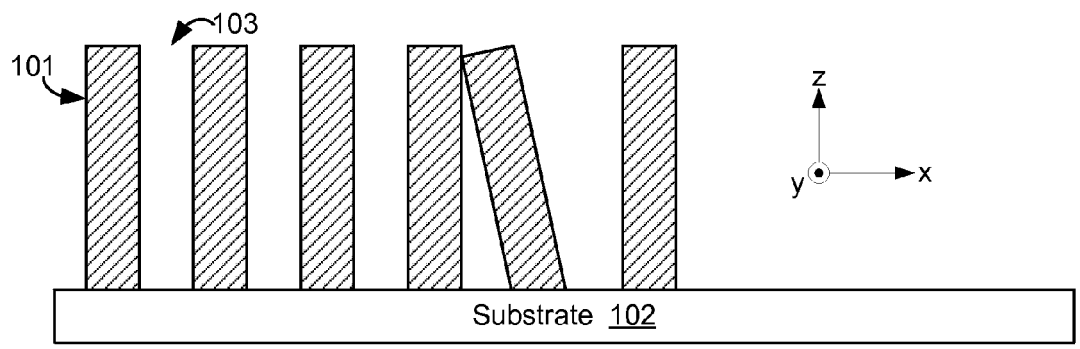
FIG.1A *(conventional art)*
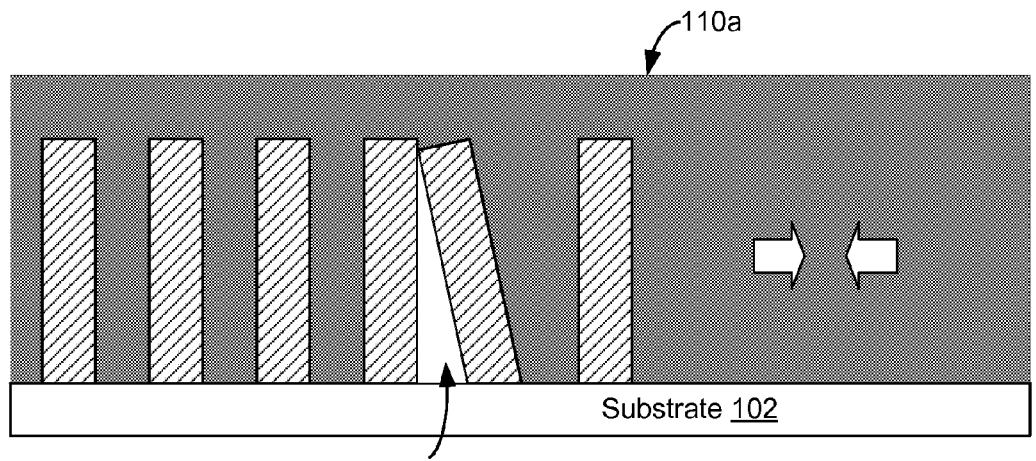
FIG.1B *(conventional art)*
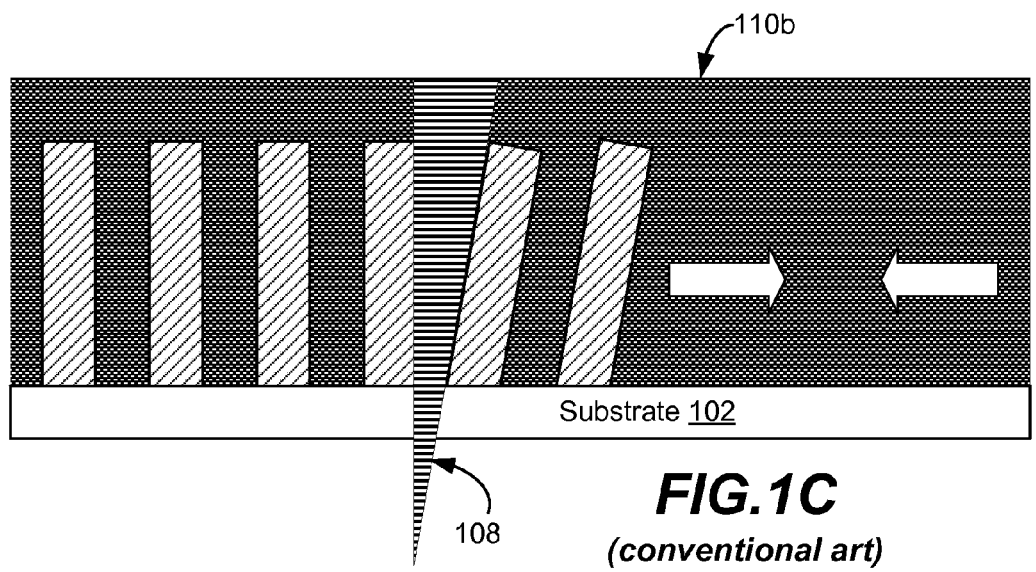
FIG.1C *(conventional art)*

Cell Region

Hookup Region

METHOD OF INHIBITING WIRE COLLAPSE

BACKGROUND

This disclosure relates to technology for forming semiconductor features.

Forming features in semiconductor circuits such as dense patterns of lines can present problems. Semiconductor device geometries continue to scale smaller and smaller, which presents even further difficulties. As the gaps between features become smaller and the aspect ratios of gap depth to width becomes greater it becomes harder to fill the gaps. When filling a high aspect ratio gap the insulator material may clog the top of the gap before it is filled. Therefore, a void may form.

Materials and techniques have been developed to prevent or reduce voids from forming due to the insulator material clogging. For example, flowable dielectrics have been developed that work very well to fill narrow gap, high aspect ratio patterns. Some of these fill materials need a treatment, such as curing after deposition.

The curing may outgas residual components, reduce the dielectric constant, complete formation of chemical bonds, etc. For example, a flowable CVD (Chemical Vapor Deposition) oxide may be treated with a high temperature steam anneal to convert the flowable CVD oxide to silicon oxide. Another technique for filling narrow gap, high aspect ratio patterns is a spin-on-dielectric (SOD). A SOD may be subjected to an ultraviolet radiation curing process.

BRIEF DESCRIPTION OF THE DRAWINGS

FIG. 1A shows a pattern of lines and gaps over a substrate.

FIG. 1B shows a void in the pattern when a dielectric material is used to fill the gaps in the structure of FIG. 1A.

FIG. 1C shows a crack that may form in the substrate when using a conventional process to fill the pattern of FIG. 1A.

DETAILED DESCRIPTION

Figure 2:
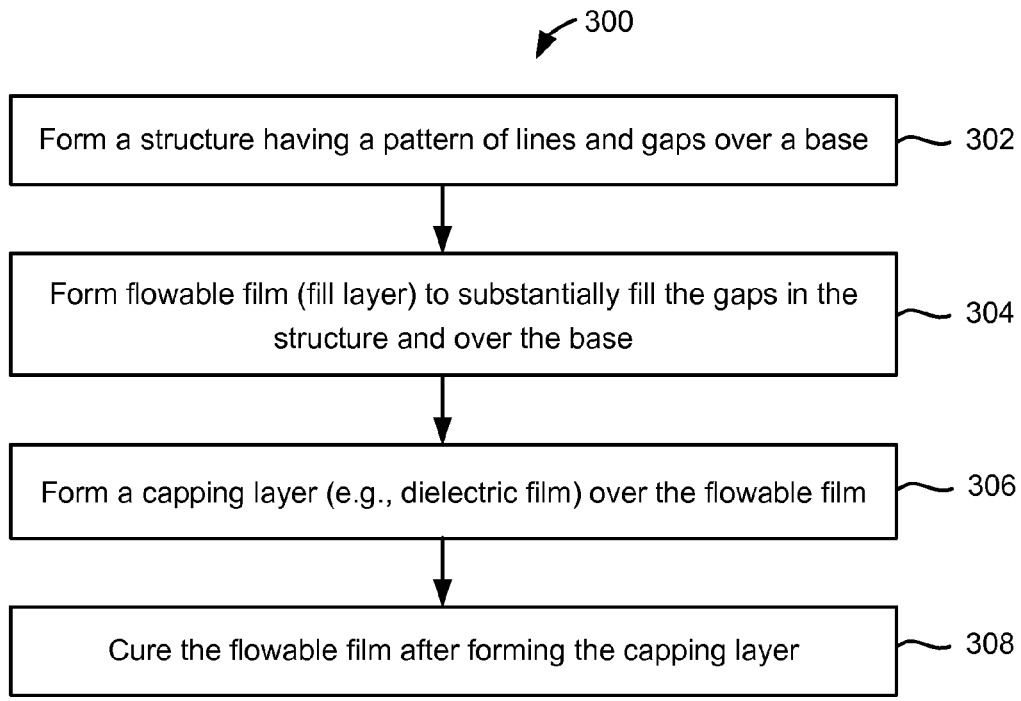
FIG. 2 is a flowchart of steps of one embodiment of a process of filing a structure having a pattern of lines and gaps (e.g., gap filling).

Fabricating features in semiconductor circuits is disclosed herein. Techniques disclosed herein substantially reduce or prevent wire flaking (collapse). As noted above, some flowable films are very good at filling gaps, but may have out gassing. This out-gassing can lead to collapse of structures formed in part from the flowable film.

One embodiment is an improved way of forming wires over trenches filled with insulating material. The wires can be located in a hookup region of a 3D memory array, and may be used to form electrical connections between conductive lines in the memory array and drivers (and/or sense amplifiers). The trenches may be formed between CMP (Chemical Mechanical Planarization) dummy structures. The CMP dummy structures may be formed from the same materials being used to form elements in the memory array, and may serve to prevent dishing during a CMP process.

The trenches between the CMP dummy structures may be partially filled with a flowable film (e.g., flowable oxide) that is subject to out-gassing. This flowable film does not completely fill the trench. The flowable film may leave a gap in the trench that is at least as wide as the total pitch of the wires to be formed. Next, an insulating capping layer is formed over the flowable film. This capping layer may be subjected to a CMP. Note that the out-gassing of the flowable film could potentially lead to wire flaking However, the capping layer can inhibit the wire flaking problem.

After forming a conductive layer over the remaining insulating capping layer, the conductive layer is etched to form conductive wires. Some of the insulating capping layer may be removed in the same pattern as the wires. Thus, the conductive wires may be at least temporarily supported by lines of material formed from the insulating capping layer. Optionally, some of the flowable oxide is also etched in the same pattern as the conductive wires. As noted above, the insulating capping layer that remains after the etching inhibits or prevents wire flaking (e.g., collapse). Later, other insulating materials may be added to fill gaps between the conductive wires, as well as gaps in the underlying insulating capping layer (and flowable oxide if that is also etched). Also, the CMP dummy material may be removed when etching the conductive wires. The CMP dummy material may be replaced by insulating material.

In one embodiment, at least some of the steps are performed while forming a memory array portion of the 3D memory array. For example, word lines or bit lines could be formed while etching to form the conductive wires in the hookup region. Also, pillars for memory cells could be etched while etching the insulating material below the conductive wires, as well as when removing the CMP dummy structures. Further details are discussed below.

Crack Free Gap Filling

Techniques disclosed herein may achieve crack free filling of structures, which may have high aspect ratios and narrow gaps. In one embodiment, a structure having a pattern of lines and gaps is formed over a base. The structure is adjacent to an open area over the base. A flowable film (e.g., flowable CVD oxide film) is formed to substantially fill the gaps in the structure and over the base in the open area adjacent to the structure. The top surface of the flowable film in the open area may be lower than the top surfaces of the lines. Moreover, the top surface may have a downward slope to it in the open area. A capping layer (e.g., dielectric film or insulating film) is formed over the flowable film. The capping layer has compressive stress in the horizontal direction. The bottom surface of the capping layer in the open area adjacent to the structure is lower than the top surfaces of the lines. The bottom surface may be formed on the downward slope of the flowable film. The flowable film is cured after forming the capping layer. The curing increases tensile stress of the flowable film in the open area in the horizontal direction. The compressive stress of the capping layer in the horizontal direction counteracts the tensile stress of the flowable film in the horizontal direction. In one embodiment, the capping layer has a compressive stress in the horizontal direction that counteracts the tensile stress of the cured flowable film in the horizontal direction to prevent a crack from forming in the base as a result of a void where the flowable film failed to fill a gap in the structure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed over," or "formed above" another element or layer, it can be directly or indirectly formed over or above the other element or layer. That is, intervening elements or layers may be present. In contrast, when an element or layer is referred to as being "directly formed on," another element, there are no intervening elements or layers present.

FIG. 1A shows a pattern of lines 101 and gaps 103 over a substrate 102. The pattern may be used to form features in a semiconductor circuit, for example. The substrate 102 could be one of many materials, including but not limited to, an insulator, monocrystalline silicon, etc. The lines 101 could be metal, polysilicon, or some other material. The lines 101 could be some combination of materials. For example, the lines could have been formed from two or more layers of materials. However, the lines 101 could also be formed from one layer of the same material. The lines extend in the y-direction and may include one or more materials in the y-direction. This pattern could be a high aspect ratio structure. Filling the gaps 103 in a high aspect ratio pattern can be difficult and can present problems.

Structures such as the one depicted in FIG. 1A may have some pattern collapse or line bending. In this example, one of the lines 101 has collapsed, such that it is leaning against another line 101. As will be described below, the pattern collapse can lead to other problems.

It may be desirable to fill the structure with a material such as a dielectric. An example dielectric is silicon oxide. Forming the dielectric may include a fill stage, as depicted in FIG. 1B, and a cure stage, which is represented in FIG. 1C. FIG. 1B shows what may happen when a fill material 110a is formed to fill the gaps 103 in the structure of FIG. 1A. The fill material 110a could be a flowable oxide. Ideally, the flowable oxide will completely fill the gaps 103 in the pattern. However, the line collapse may result in a void 106 that the fill material 110a does not fill. In this example, the void 106 is between the collapsed line and its neighbor. Note that even if the fill material 110a is in general very effective at gap filling a void may still occur in situations such as the line collapse and other situations.

As noted, some fill material 110a materials need to be treated after being deposited. For example, a steam anneal might be performed after depositing a flowable CVD (Chemical Vapor Deposition) oxide to convert it to silicon oxide. The steam anneal may increase the tensile stress of the flowable CVD oxide. As another example, a spin-on-dielectric (SOD) might undergo an ultraviolet curing process.

Note that the fill material 110a may shrink as a result of the curing process. There may be more shrinkage in the open area adjacent to the structure than in the gaps in the structure.

Also, the tensile stress of the flowable CVD oxide, SOD, or other material may increase as a result of the curing treatment. Tensile stress is represented in FIG. 1B by the two arrows pointing towards each other. This tensile stress has a component that is horizontal to the substrate 102. Tensile stress is also represented in FIG. 1C by the two arrows pointed at each other. The length of the arrows is longer in FIG. 1C to represent that the tensile stress has increased as a result of treating the fill material 110a. Note that these arrows represent the tensile stress in the open area adjacent to the pattern. As noted, this tensile stress may have a component that is horizontal to the substrate 102.

This tensile stress in the open area adjacent to the structure can induce a crack in the substrate 102. A possible reason for the crack in the substrate 102 is due to the void 106. The tensile stress in the open area adjacent to the structure may pull the pattern. This is represented by two of the lines leaning to the right. Note that the void 106 may exacerbate this problem. This can result in a crack 108 forming. The crack 108 may not only impact the fill layer/structure region, but could also crack the substrate 102.

Also, note that the tensile stress (if any) prior to treatment may not be sufficient to crack the substrate 102, even if there is a void 106. However, the crack may result due to the total magnitude of the tensile stress after treatment. If there were no void 106, it may be that the substrate 102 would not crack even with the increased tensile stress. However, a void is not required for a crack to form in the substrate 102.

Semiconductors are often fabricated with many different layers. Thus, a pattern of lines is not necessarily fabricated directly on a substrate 102. Instead, the pattern of lines might be formed directly on a layer that may comprise, for example, metal lines interspersed with dielectric. In such a case, the problem of cracking can still occur. In this case, the layer just below the pattern of lines can crack. In some cases, the crack may extend through this lower layer all of the way into the substrate.

Figure 3A:
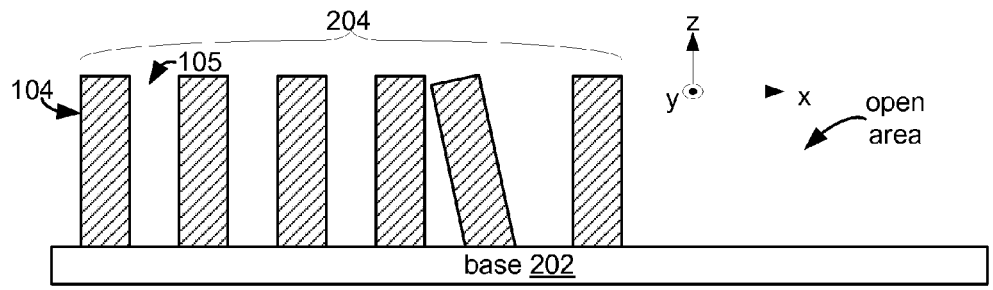
FIGS. 3A, 3B, 3C, and 3D show results after various steps the process of FIG. 2.

FIG. 2 is a flowchart of steps of one embodiment of a process 300 of filing a structure having a pattern of lines and gaps (e.g., gap filling). FIGS. 3A-3D show results after various steps of the process 300, in accordance with embodiments. In step 302, a structure having a pattern of lines and gaps is formed over a base 202. FIG. 3A shows results after one embodiment of step 302. FIG. 3A shows a structure 204 having a pattern of lines 104 and gaps 105 over a base 202. The base 202 could be a substrate, such as monocrystalline silicon, IV-IV compounds such as silicon-germanium or silicon carbon, III-V compounds, II-VII compounds, etc. However, the base 202 could be some layer above a substrate. The base 202 could be an epitaxial layer over a substrate. The base 202 could be a layer that includes metal lines and dielectric material that is formed above a substrate.

There is an open area over the base 202 adjacent to the structure 204. As noted earlier, an open area adjacent to a structure 204 being filled can potentially have an impact on structural integrity of the structure and base.

One of the lines 104 has collapsed and is leaning against its neighbor. It is not required that a line 104 has collapsed, but this is depicted for purposes of explanation. In one embodiment, the lines 104 are used to form memory cells in a 3D memory array, as well as conductors (e.g., bit lines or word lines). For example, a single line 104 may be used to form one conductor in the y-direction and multiple memory cells. Note that the lines may be etched in the x-direction to form individual memory cells from one of the lines. In the example of a 3D memory array, the open area may be a region adjacent to an array of memory cells. However, note that the structure 204 is not limited to use in a 3D memory array.

An example height for the structure 204 is about $3.5 \times 10^{-7}$ meters (about 350 nm). An example line width is $3 \times 10^{-8}$ meters or less (30 nm or less). Thus, the aspect ratio could be greater than 10. The structure 204 could be taller or shorter than 350 nm. The lines could be wider or narrower than 30 nm. The aspect ratio could be greater than 10 or less than 10. The open area adjacent to the structure 204 could be about $1 \times 10^{-7}$ to $1 \times 10^{-4}$ meters (100 nm-100 µm), as an example range. In one embodiment, the open area extends at least $1 \times 10^{-6}$ meters (1 µm) away from the structure 204.

Figure 3B:
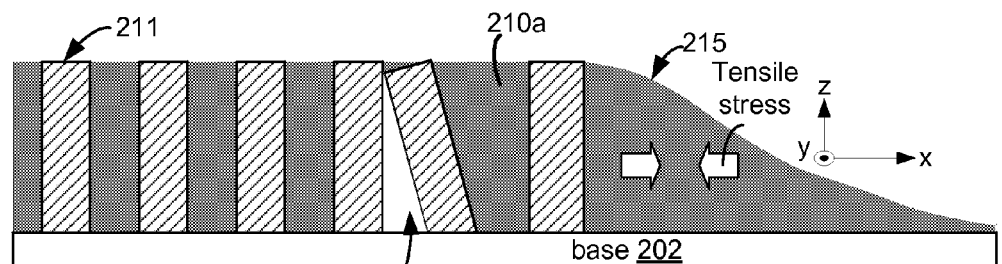

In step 304, a flowable film is formed to substantially fill the gaps 105 in the structure 204. By substantially filling the gaps 105 it is meant that there may be some voids where the flowable film does not completely fill the gaps. Also, it may be that the flowable film does not completely reach to the top of each gap 105. The flowable film is also formed over the base 202 in the open area adjacent to the structure 204. FIG. 3B shows results after one embodiment of step 304. A flowable film has been deposited and substantially fills the open gaps 105 in the structure 205. The flowable film forms a fill layer 210a. There may be a void 106 in the fill layer 210a. In this example, the void 106 results due to the collapse of the line pattern. However, a void could result for other reason. The fill layer 210a has approximately the minimum thickness within the structure 204 to reach the top surfaces of the structure 204, in one embodiment. One of the top surfaces 211 of a line 104 is pointed out in FIG. 3A. The fill layer 210a has a top surface 215 outside of the structure 204 that is lower than the top surfaces 211 of the lines 104. In one embodiment, the top surface 215 of the flowable film slopes downward moving away from the structure 204. Note that there may be a downward slope to this surface 215. In one embodiment, the downwards slope results due to surface tension.

In one embodiment, the flowable film is a flowable oxide film. This may be a flowable CVD oxide film. In one embodiment, the flowable film is a flowable spin on dielectric (SOD). In one embodiment, the flowable film is PSZ (polysilazane). The flowable film could be a different type of SOD. In one embodiment, the flowable film is carbon free. The composition of the flowable film may be $Si_xN_yH_z(O)$. In one embodiment, the flowable film does include carbon. For example, the composition of the flowable film may include silicon, oxygen, carbon, and hydrogen.

When deposited, the flowable film may have a relatively small tensile stress. Tensile stress, which may have a component that is horizontal (e.g., x-direction) to the base 202, is represented in FIG. 3B by the two arrows pointing towards each other. Thus, there may be some tensile stress in the open area adjacent to the structure 204. The relatively small tensile stress is typically not strong enough to cause a problem of cracking the base 202. As one example, the tensile stress may be less than 150 MPa. It may be that there is no tensile stress in the flowable film at this point. Thus, the tensile stress might be between 0 MPa and 150 MPa. Note that these are just example values for the tensile stress.

Figure 3C:
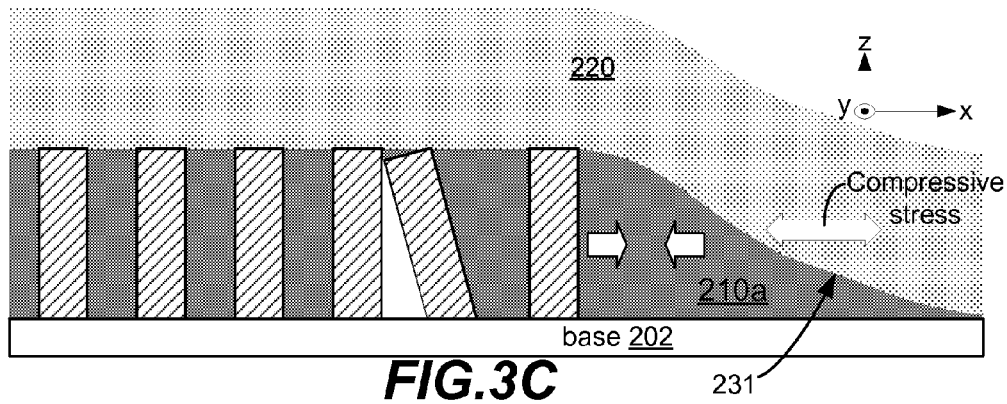

In step 306, a capping layer (e.g., dielectric film) is formed over the flowable film. FIG. 3C depicts results after step 306. The capping layer 220 covers the fill layer 210a over the structure 204 and over the open area adjacent to the structure 204. The capping layer 220 has a bottom surface 231 that may be in contact with the top surface 215 of the fill layer 210a, in one embodiment. The bottom surface 231 is lower than the top surfaces 211 of the lines 205. In one embodiment, a portion of the capping layer 220 is formed on the downward slope of the flowable film 210. This may be formed directly on the downward slope of the flowable film 210. Alternatively, it may be formed indirectly on the downward slope of the flowable film 210.

The capping layer 220 may have compressive stress. Compressive stress having a component that is along the x-axis (e.g., parallel to the base 202) is represented by the double-sided arrow in FIG. 3C. This compressive stress may counteract the tensile stress of the flowable film in the fill layer 210a.

As one example, it might be that a net stress of about +150 MPa adjacent to the structure 204 would present a substantial risk of cracking the base 202. Note that a greater or lower magnitude of tensile stress might present such a substantial risk. If the tensile stress after depositing the flowable film is less than this, then a substantial risk of cracking the base 202 may be avoided. After depositing the capping layer, the compressive stress may counteract the tensile stress. As one example, the compressive stress may be about −100 to −150 MPa. Thus, in absolute magnitude this could be less than or greater than the initial tensile stress of the flowable film. However, there should not be a substantial risk of cracking the base 202.

In one embodiment, the thickness of the capping layer 220 depends on the thickness of the fill layer 210. In one embodiment, the capping layer 220 is thicker than the fill layer 210. However, the capping layer 220 could be thinner than the fill layer 210. Here, the thickness of the fill layer 210 refers to the thickness in the region of the structure 204. Similarly, the thickness of the capping layer 220 refers to the thickness above the structure 204

In one embodiment, the capping layer 220 is formed from a flowable CVD oxide film. In one embodiment, the capping layer 220 is formed using PE-CVD (Plasma Enhanced CVD). In one embodiment, the capping layer 220 is a silicon oxide layer formed using PE-CVD. This may be referred to as a PE-TEOS silicon oxide layer. In one embodiment, the capping layer 220 is a layer of silicon oxide formed using PE-CVD with tetraethylorthosilicate (TEOS) as a source. As one example, a silicon oxide PE-TEOS capping layer 220 may be formed with a temperature over 300C, a pressure between 3-10 Torr, 13.56 MHz RF and 300-400 Hz LF plasma, and $O_2$ gas may be used as a oxidation gas.

In one embodiment, the capping layer 220 is a silicon nitride layer formed using PE-CVD. As one example, a silicon nitride PE-CVD capping layer 220 may be formed with a temperature between 350-450 degrees C. and a pressure between 3-10 Torr. An RF power of more than 100 W may be used.

In one embodiment, the capping layer 220 is a silicon oxide layer formed using HDP-CVD. As one example, a silicon oxide HDP-CVD capping layer 220 may be formed with a temperature over 200 C and a pressure under 1 Torr. $SiH_4, O_2$ may be used. Ar, He or $H_2$ may be added to optimize the process.

In one embodiment, a bias power is used to achieve compressive stress in the capping layer 220.

The foregoing process parameters are examples. The capping layer 220 could be formed from other materials and/or using other processes. All process parameters could be higher or lower than those specified.

Figure 3D:
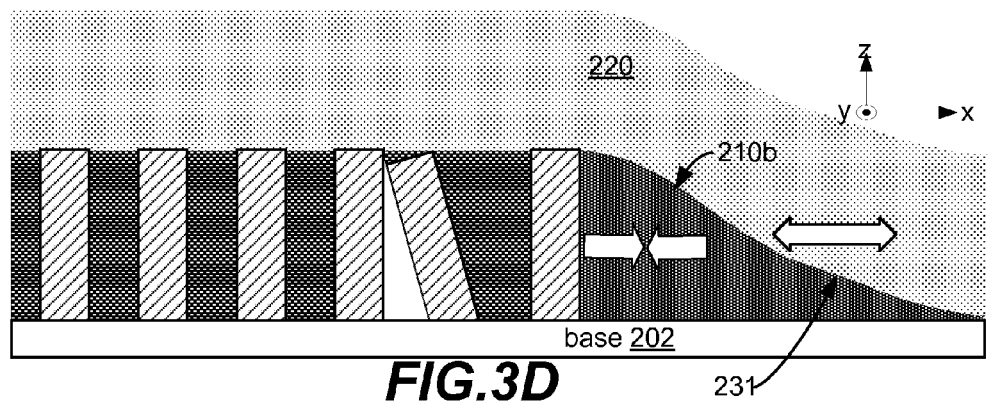

In step 308, the flowable film is cured. In one embodiment, the flowable film is converted to silicon oxide. Reference numeral 210a is used to represent the fill layer prior to curing the flowable film. Reference numeral 210b is used to represent the fill layer after curing the flowable film (e.g., converting to silicon oxide). Note that this step is performed after forming the capping layer 220 having compressive stress. FIG. 3D depicts results after step 308.

Curing the flowable film (e.g., converting the flowable film to silicon oxide) may increase the tensile stress. This is represented in FIG. 3D by the increased length of the arrows. However, the compressive stress of the capping layer 220 in the open area counteracts the tensile stress of the fill layer 210b in the open area after conversion. For example, the x-axis component of the compressive stress of the capping layer 220 counteracts the x-axis component of the tensile stress of the fill layer 210 after conversion to silicon oxide. In one embodiment, the capping layer 220 (e.g., dielectric film) has a compressive stress in the horizontal direction in the open area that counteracts the tensile stress of the flowable film in the horizontal direction in the open area after the flowable film is cured (e.g., converted to silicon oxide) to prevent a crack from forming in the base 202 as a result of a void 106 where the flowable film failed to fill a gap 105 in the structure 204.

As one example, the tensile stress of the flowable film of the fill layer 210 may be about +230 MPa after is it is cured (e.g., converted to silicon oxide). If there were no capping layer 220 having compressive stress to counteract the tensile stress, then there may be a substantial risk of cracking the base (e.g., if there is a void). The compressive stress of the capping layer 220 may be about −100 to −150 MPa. Thus, the compressive stress of the capping layer 220 may substantially balance the tensile stress of the fill layer 210b after curing. It is not required that the compressive stress of the capping layer 220 completely balance the tensile stress of the fill layer 210b after curing. That is, it is not required that the compressive stress be equal (but opposite) the tensile stress. In the foregoing example, the absolute magnitude of the compressive stress is less than the absolute magnitude of the tensile stress. However, the absolute magnitude could be greater.

In one embodiment, step 308 includes performing a high temperature steam anneal. For example, a flowable CVD oxide film that comprises $Si_xN_yH_z(O)$ may be converted to silicon oxide by performing a steam anneal.

In one embodiment, step 308 includes exposing the materials being formed to ultraviolet radiation. For example, the structure of FIG. 3C may be exposed to ultraviolet radiation, which may cure the flowable film. This may be used when the flowable film is a SOD, but is not so limited.

Figure 4:
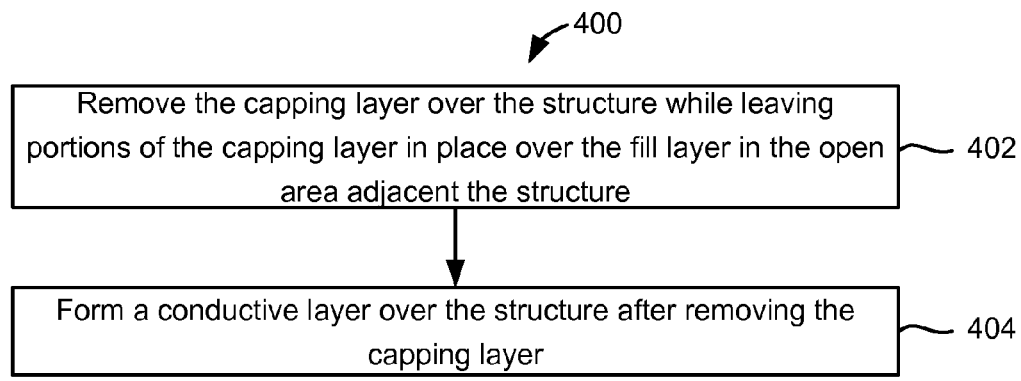
FIG. 4 is a flowchart of one embodiment of a process of removing portions of a capping layer.
Figure 5A:
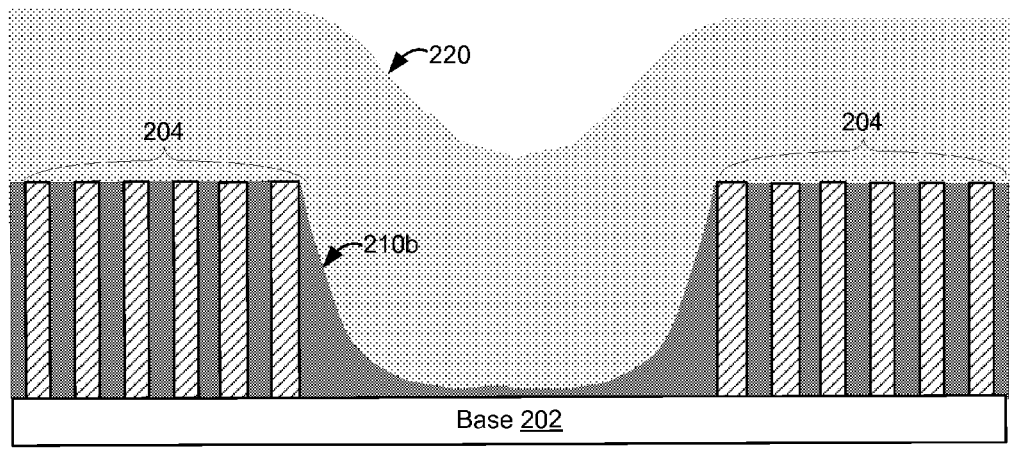
FIGS. 5A, 5B, and 5C show results after various steps the process of FIG. 4.
Figure 5B:
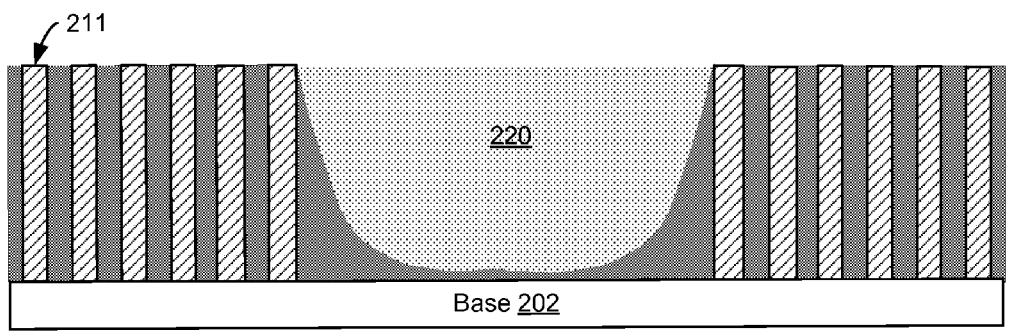
Figure 5C:
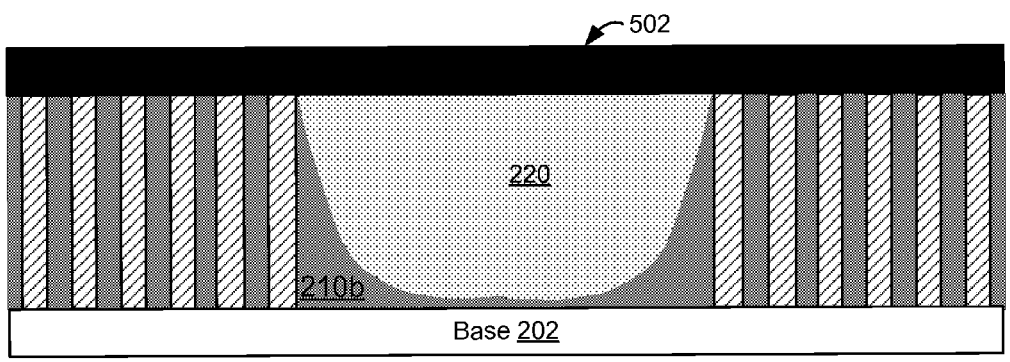

In one embodiment, portions of the capping layer 220 are removed such that another layer may be formed over, and possibly in contact with, the structure 204. FIG. 4 is a flowchart of one embodiment of a process of removing portions of the capping layer. FIGS. 5A-5C will be used to illustrate. FIG. 5A shows elements that can be formed using the process of FIG. 2 prior to the process of FIG. 4. FIG. 5A shows two structures 204, each having a pattern of lines and gaps. The structures 204 have been filled with a fill layer 210. A capping layer 220 is formed over the fill layer 210. The fill layer 210b has been cured (e.g., converted to silicon oxide). There was an open area between the two structures 204 that is now filled with portions of the fill layer 210b and the capping layer 220. Note that even though the open area is now filled, for purpose of discussion of this and other examples, it will still be referred to as the open area adjacent to the structure 204. In this example, neither structure 204 has a collapsed line. However, either or both structures 204 could have one or more collapsed lines.

In step 402, portions of the capping layer 220 are removed over the structures 204, while leaving portions of the capping layer 220 in place over the fill layer 210 in the open area between the structures 204. FIG. 5B depicts results after step 402. In one embodiment, the capping layer 220 is planarized (e.g., CMP). Thus, the capping layer 220 may be completely removed directly above the structures 204. The capping layer 220 may be planarized such that its top surface is level with the top surfaces 211 of the lines.

In step 404, a conductive layer is formed over the top of the structure 204 after removing the capping layer 220. FIG. 5C depicts results after step 404, showing a conductive layer 502 over the top surfaces 211 of the lines of the structures. In one embodiment, the conductive layer 502 is in direct contact with the top surfaces 211 of the lines. However, an intermediate layer, such as an adhesion layer, may be between the conductive layer 502 and the structure 204. However, the conductive layer 502 may still be in electrical contact with the top surfaces 211 with or without an intermediate layer.

Note that after process 400 portions of the capping layer 220 still exist to provide a compressive stress to counteract tensile stress of the fill layer 210 adjacent to the structures 204. Therefore, cracking of the base 202 may be reduced or prevented.

Figure 6A:
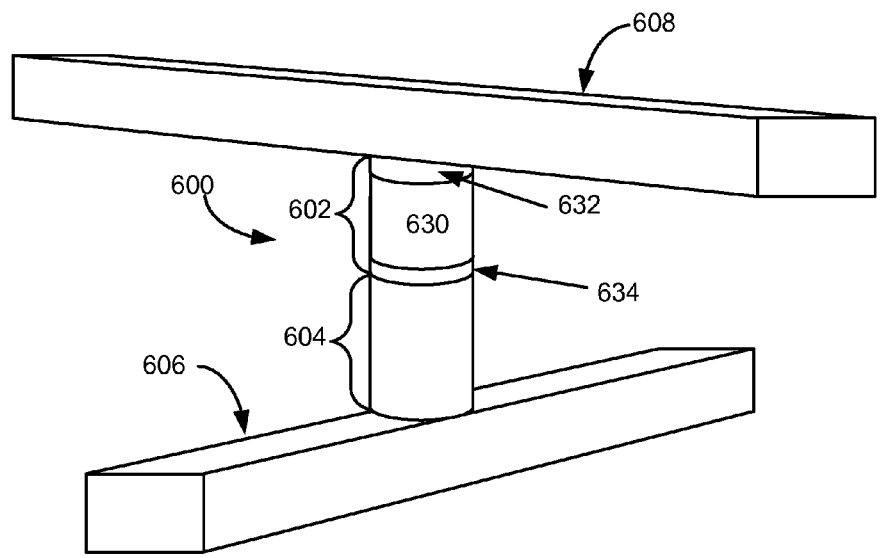
FIG. 6A is a simplified perspective view of one embodiment of a memory cell which includes a reversible resistivity-switching element coupled in series with a steering element.

In one embodiment, portions of a 3D memory array are formed. The 3D memory array may have reversible resistivity-switching element memory cells. Sometimes such memory cells are referred to as ReRAM. Prior to discussing forming a memory array, an example memory cell and memory arrays will be discussed. FIG. 6A is a simplified perspective view of one embodiment of a memory cell 600 which includes a reversible resistivity-switching element 602 coupled in series with a steering element 604. The memory cell is between a first conductor 606 and a second conductor 608. The first and second conductors 606, 608 may be referred to as a word line and a bit line, or as a y-conductor and an x-conductor.

Reversible resistivity-switching element 602 includes reversible resistivity-switching material 630 having a resistance that may be reversibly switched between two or more states. For example, the reversible resistivity-switching material may be in an initial high-resistance state upon fabrication that is switchable to a low-resistance state upon application of a first physical signal. For example, the device may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used.

In one embodiment, the process of switching the resistance from the high-resistance state to the low-resistance state is referred to as SETTING the reversible resistivity-switching element 602. The process of switching the resistance from the low-resistance state to the high-resistance state is referred to as RESETTING the reversible resistivity-switching element 602. The high-resistance state may be associated with binary data "0" and the low-resistance state is associated with binary data "1." In other embodiments, SETTING and RESETTING and/or the data encoding can be reversed.

In some embodiments, reversible resistivity-switching material 630 may be formed from a metal oxide. Various different metal oxides can be used. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Reversible resistivity-switching element 602 includes electrodes 632 and 634. Electrode 632 is positioned between reversible resistivity-switching material 630 and conductor 608. In one embodiment, electrode 632 is made of TiN. Electrode 634 is positioned between reversible resistivity-switching material 630 and diode 604. In one embodiment, electrode 634 is made of Titanium Nitride.

Conductors 606 and 608 may include any suitable conductive material such as tungsten, any appropriate metal, heavily-doped semiconductor material, a conductive silicide, a conductive silicide-germanide, a conductive germanide, or the like. In the embodiment of FIG. 6A, conductors 606 and 608 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 606 and 608 to improve device performance and/or aid in device fabrication.

Figure 6B:
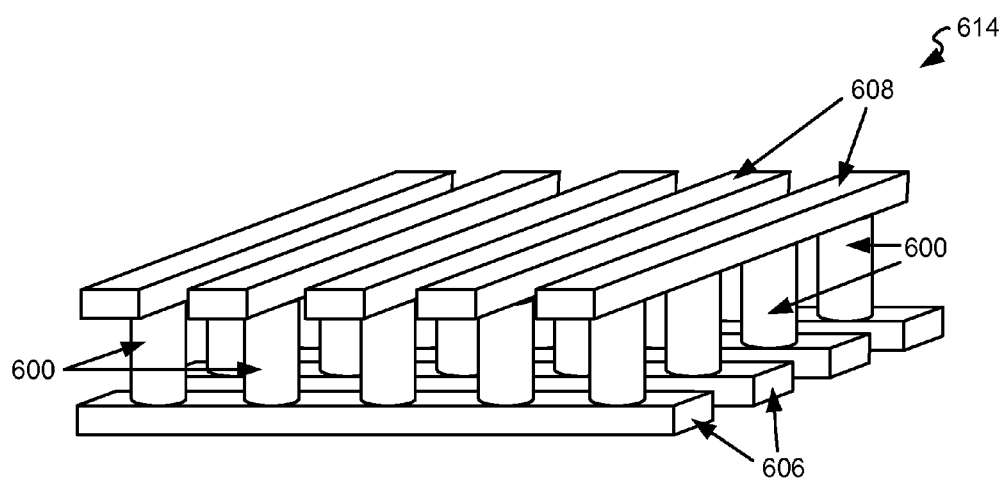
FIG. 6B is a simplified perspective view of a portion of a first memory level formed from a plurality of the memory cells of FIG. 6A.

FIG. 6B is a simplified perspective view of a portion of a first memory level formed from a plurality of the memory cells 600 of FIG. 6A. For simplicity, the reversible resistivity-switching element 602 and the steering element 604 are not separately shown. The memory array 614 is a "cross-point" array including a plurality of first conductors 606 (e.g., word lines) and a plurality of second conductors 608 (e.g., bit lines) between which multiple memory cells are coupled (as shown). Other memory array configurations may be used, as may multiple levels of memory.

Figure 6C:
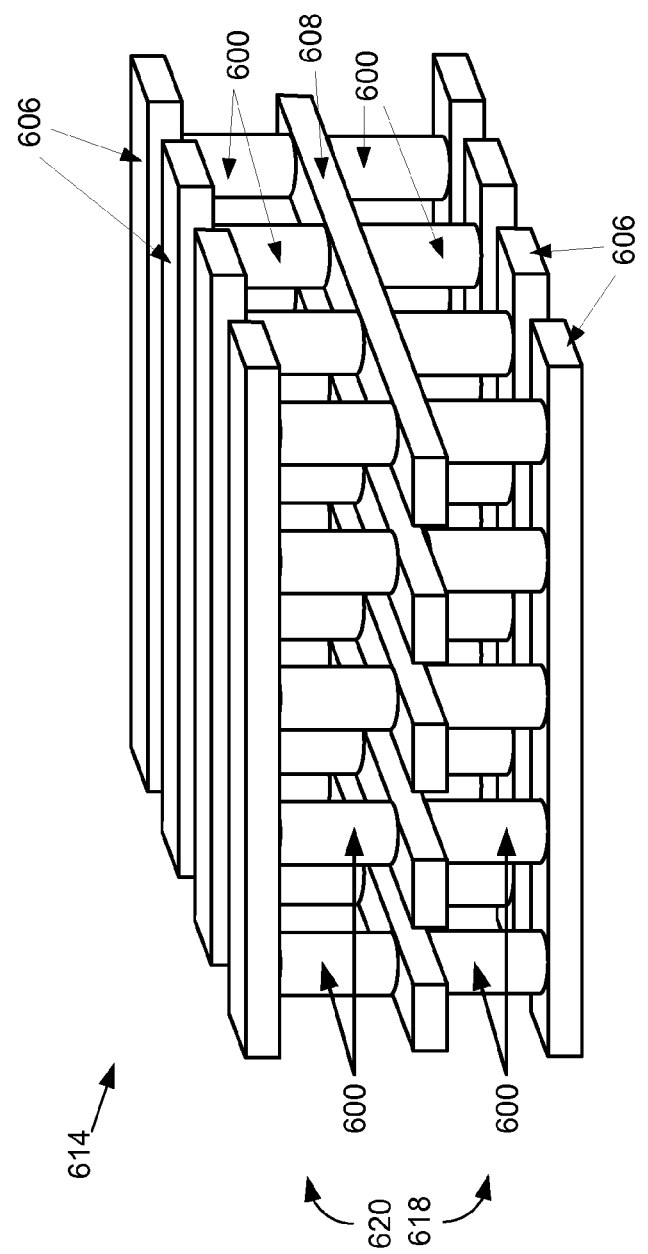
FIG. 6C is a simplified perspective view of a portion of a monolithic three-dimensional array that includes a first memory level positioned below a second memory level.

FIG. 6C is a simplified perspective view of a portion of a monolithic three-dimensional array 616 that includes a first memory level 618 positioned below a second memory level 620. In the embodiment of FIG. 6C, each memory level 618 and 620 includes a plurality of memory cells 600 in a cross-point array. Other memory array configurations may be used, as may additional levels of memory.

FIGS. 6A-6C show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material.

Figure 7:
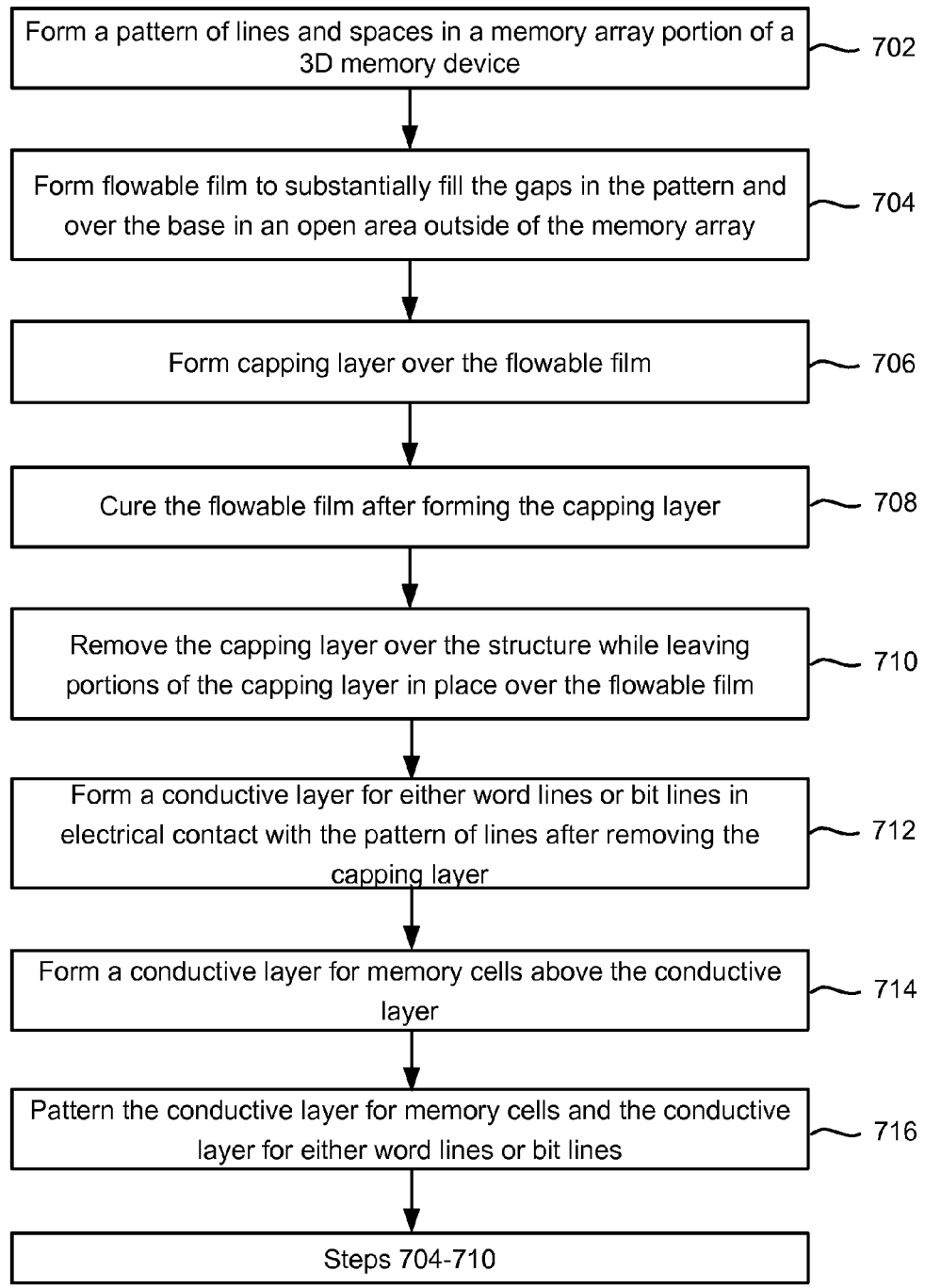
FIG. 7 is a flowchart of one embodiment of a process of forming portions of a 3D memory array.

FIG. 7 is a flowchart of one embodiment of a process 700 of forming portions of a 3D memory array. The process 700 may be used to form memory arrays such as those depicted in FIGS. 6B and 6C, but is not limited to those memory arrays. Process 700 includes forming a capping layer having compressive stress over a fill layer having tensile stress. The compressive stress may counteract the tensile stress adjacent to the memory array to prevent a crack from forming in a substrate. FIGS. 8A-8D show results after various steps of the process of FIG. 7. Various steps in process 700 are embodiments of steps in the processes of FIG. 2 and FIG. 4.

In step 702, a pattern of lines and gaps is formed for a memory array portion of a 3D memory device. This pattern may be the basis for conductive lines (e.g., bit lines or word lines) and memory cells. This pattern may be formed over a base 202. Step 702 is one embodiment of step 302.

In step 704, a fill layer (e.g., flowable film) is deposited to substantially fill the gaps in the pattern. The flowable film also extends over a portion of the base (e.g., substrate) adjacent to the structure. For example, the flowable film may cover a portion of the base adjacent to the memory array. Step 704 is one embodiment of step 304.

In step 706, a capping layer (e.g., dielectric film) is formed over the flowable film. Step 706 is one embodiment of step 306. In step 708, the flowable film is cured (e.g., converted to silicon oxide) after depositing the capping layer. Step 708 is one embodiment of step 308.

In step 710, the capping layer is removed over the structure, while leaving portions of the capping layer in place adjacent to the memory array. The capping layer may be planarized using CMP. Step 710 is one embodiment of step 402.

Figure 8A:
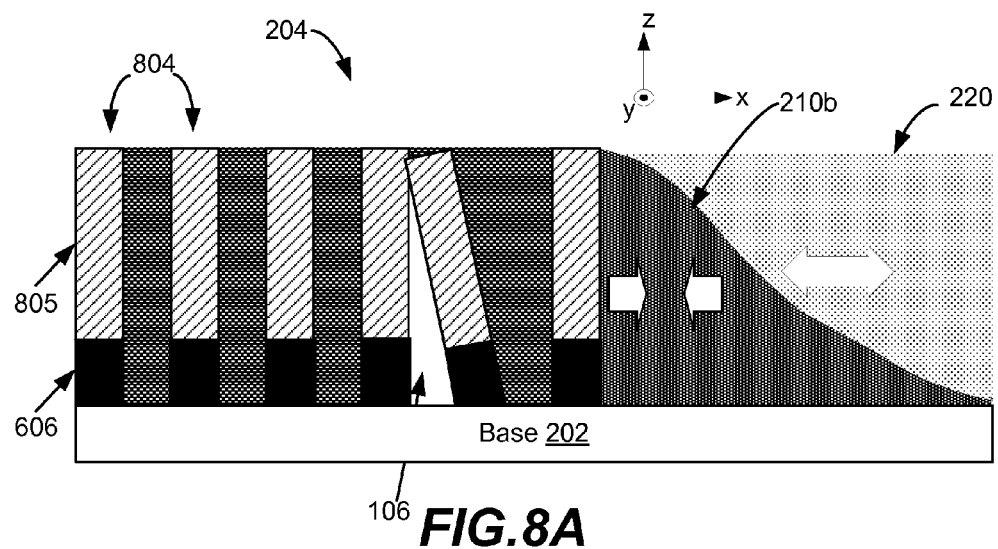
FIGS. 8A, 8B, 8C, and 8D show results after various steps of the process of FIG. 7.

FIG. 8A depicts results after step 710. The lines 804 in FIG. 8A will be used for y-conductors and memory cells above the y-conductors. Referring back to FIG. 6C, these lines may be used for the lowest level of conductors 606 that extend in the y-direction and for the memory cells 600 just above. At this point no cut has been made in the x-direction. Hence the lines extend in the y-direction at this time. A portion of a y-conductor 606 is referenced at the bottom of one of the lines. A "memory cell" line 805, which will be used to form many memory cells after etching in the x-direction is depicted.

The gaps between the lines 804 have been substantially filled with the flowable film 210b (which has been cured as of this step). However, there may be a void 106 where a line 804 has collapsed. The void 106 is not a requirement. The capping layer 220 is shown over the cured flowable film 210b in the open area adjacent to the structure. The capping layer 220 is formed over the downward slope of the flowable film 210b. This may be directly or indirectly on the flowable film 210b. Note that this structure may be a portion of a memory array. Hence, this open area may be adjacent to a memory array. In one embodiment, the compressive stress of the capping layer 220 in the horizontal direction substantially balances the tensile stress of the cured flowable film 210b in the horizontal direction in the open area outside of the memory array. This be prevent or reduce cracks in the base 202

In step 712, a conductive layer for either word lines or bit lines is formed over the pattern of lines. This conductive layer may be in direct contact with the structure 204, but that is not a requirement. In one embodiment, there is an intermediate layer between the conductive layer and the structure 204. Step 712 is one embodiment of step 404 from FIG. 4.

Figure 8B:
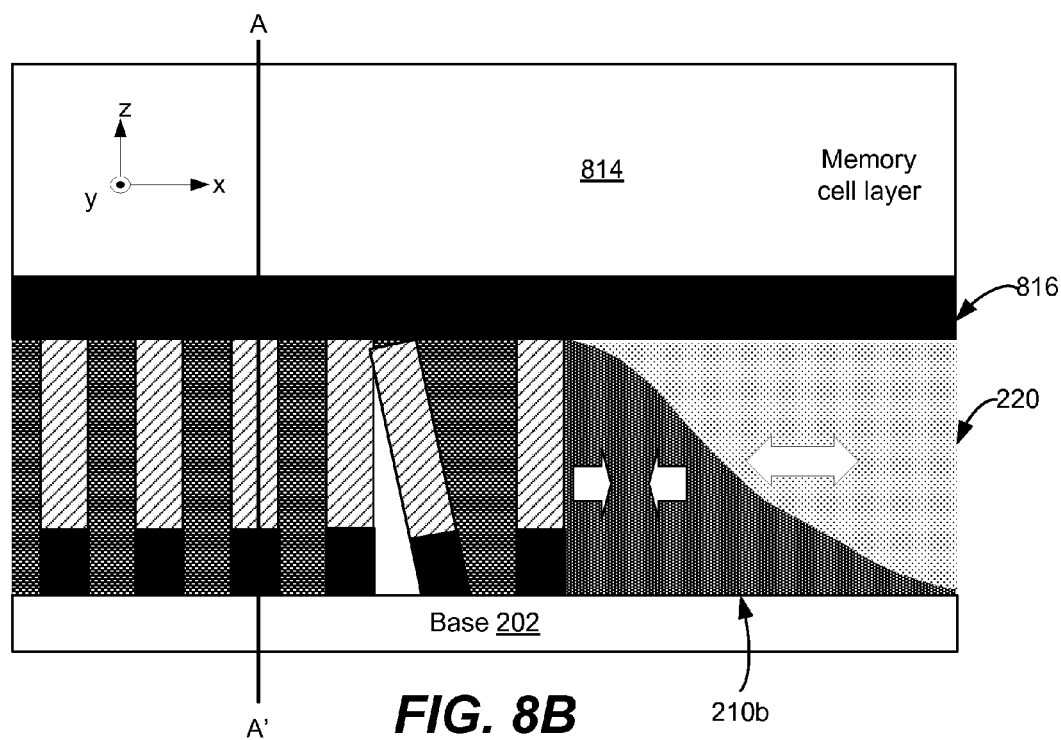

In step 714, a layer for memory cells is formed over the conductive layer. This layer may have many different sub-layers. FIG. 8B depicts results after one embodiment of step 714. FIG. 8B shows a conductive layer 816 over the structure 204, as well as a memory cells layer 814. As shown in FIG.

6A, the memory cell may have numerous different materials. Thus, one or more layers could be formed for the steering element 604, and several layers for the switching element 602.

Figure 8C:
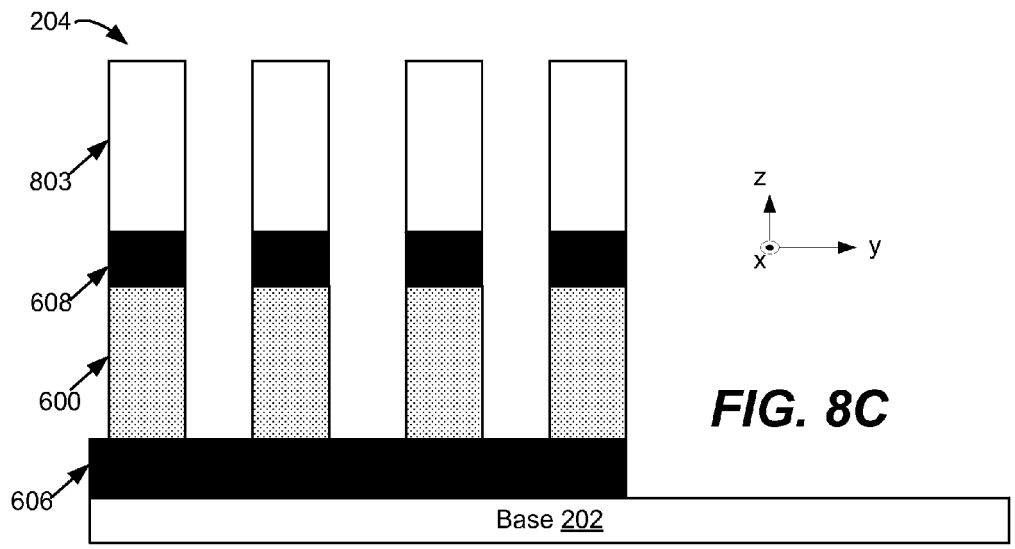

In step 716 the conductive layer and memory cell layer are patterned and etched. FIG. 8C depicts results after one embodiment of step 716. FIG. 8C depicts a cross section of structure of FIG. 8B along reference line A-A'. FIG. 8C shows an yz-plane perspective. From this perspective, a lower conductive line 606 is seen above the base 202. This conductive line extends in the y-direction. A lower layer of memory cells 600 are shown. These may correspond to the lower layer 618 in FIG. 6C. Above that are conductive lines 608. These conductive lines extend in the x-direction. Above that are lines 803 that will be used to form an upper layer of memory cells. Further etching (in the y-direction) may be used to form the memory cells from region 803.

Note that in this example, a structure 204 having a dense pattern of lines is formed from many different materials. The etching from step 716 formed lines from the memory cell layer (FIG. 8B, 814) and conductive layer (FIG. 8B, 816) shown in FIG. 8B. The etching from step 716 also etched below that to form the lower memory cells 600 from the lines. Referring back to FIG. 8B, it can be seen that this portion of the line that extends in the x-direction has alternating memory cell portions and fill layer portions. Thus, the dense pattern of lines to be filled can be quite complex. In the example of FIG. 8C, there is an open area adjacent to the structure 204 to be filled.

Figure 8D:
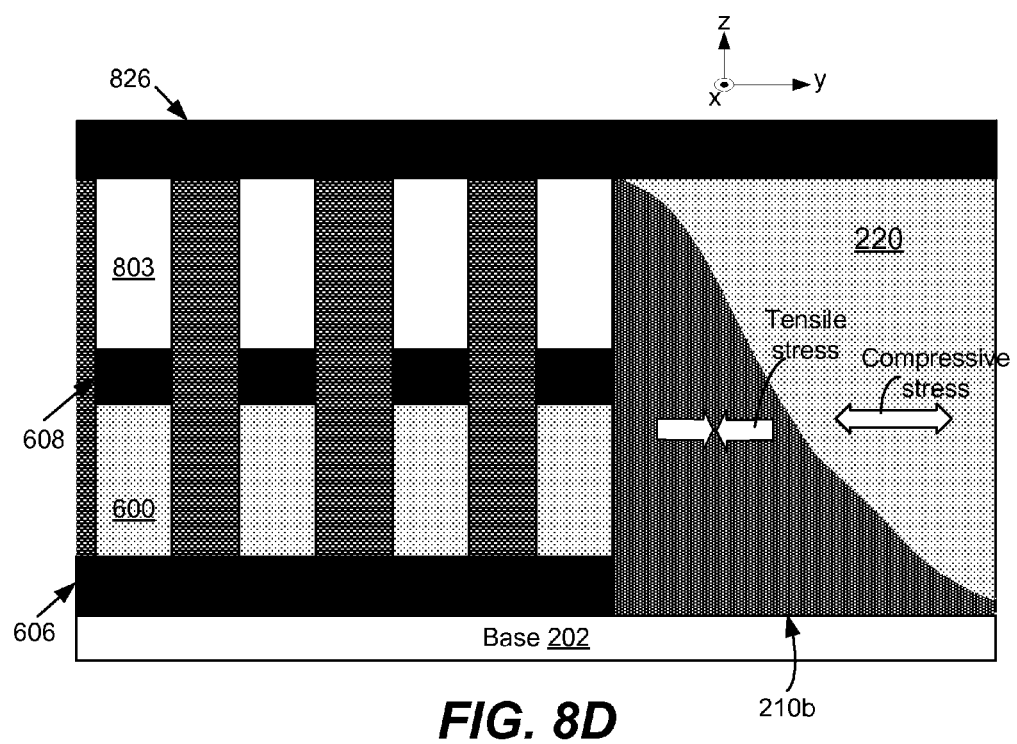

Next, steps 704-712 may be repeated to fill the structure with a flowable film 210, add a capping layer 220, cure the flowable film (e.g., convert to silicon oxide), and planarize the capping layer. Also, a conductive layer may be deposited. FIG. 8D depicts results after such additional steps. Note that the compressive stress of the capping layer 220 may counteract the tensile stress of the cured fill layer 210*b*. This may prevent a crack from forming in the base 202 as a result of a possible void in the structure. As previously noted, the tensile stress of the cured fill layer 210*b* can lead to a crack in the based 202 if there is a void in the structure 204.

Additional steps may be formed to form memory cells from regions 803 (which are lines at this point) and to form y-conductors from conductive layer 826. Thus, a structure such as the one depicted in FIG. 6C may be formed. Note that many other layers can be added to the top of that structure. When forming additional layers, the pattern of lines and gaps may be formed on a layer other than a substrate. For example, an additional memory cell layer may be formed on top of the structure of FIG. 8D (this may be prior to etching the top metal layer to form the top conductors 606). Then, the additional memory layer, conductive layer 826, and the memory lines 803 below that may be etched. This etch may create a dense pattern of lines and gaps. Note that the further up processing goes, the more damage may be done to the structure as a result of a crack. For example, many different layers of the 3D memory array could be damaged by a crack that is initiated when processing an upper layer. This crack may or may not reach all the way down to the substrate. However, by using techniques disclosed herein, a crack may be prevented.

One embodiment includes a method of forming features in a semiconductor device, which comprises the following. A structure having a pattern of lines and gaps is formed over a base that extends in a horizontal direction. The lines have top surfaces. The structure is adjacent to an open area over the base. A flowable film is formed to substantially fill the gaps in the structure and over the base in the open area adjacent to the structure. The flowable film has a top surface in the open area that is lower than the top surfaces of the lines. A dielectric film is formed over the flowable film. The dielectric film has compressive stress in the open area in the horizontal direction. The dielectric film has a bottom surface in the open area adjacent to the structure that is lower than the top surfaces of the lines. The flowable film is cured after forming the dielectric film. The curing increases tensile stress of the flowable film in the open area in the horizontal direction. The compressive stress of the dielectric film in the horizontal direction counteracts the tensile stress of the flowable film in the horizontal direction in the open area.

One embodiment includes a method of forming a 3D memory device, which comprises the following. A pattern of lines and gaps in a memory array portion the 3D memory device is formed. The lines have top surfaces. The pattern is adjacent to an open area outside of the memory array. A flowable film is formed to substantially fill the gaps in the pattern and over a base in the open area outside of the memory array. The flowable film has a top surface in the open area outside of the memory array that is lower than the top surfaces of the lines and has a top surface within the pattern to substantially fill the gaps to the top surfaces of the lines. A capping layer is formed over the flowable film. The capping layer has compressive stress in a horizontal direction in the open area. The capping layer has a lower surface outside of the pattern that is lower than the top surfaces of the lines. The flowable film is cured after forming the capping layer. Curing the flowable film increases tensile stress of the flowable film in the horizontal direction in the open area. The compressive stress of the capping layer in the horizontal direction counteracts the tensile stress of the cured flowable film in the horizontal direction in the open area. The capping layer is removed over the pattern while leaving portions of the capping layer in place over top of the flowable film in the open area outside of the memory array. A conductive layer for either word lines or bit lines is formed in electrical contact with the pattern of lines after removing the capping layer.

One embodiment includes a method of forming features in a semiconductor device, which comprises the following. A dense pattern of lines and gaps is formed over a substrate that has a surface that extends horizontally. The lines have top surfaces. The dense pattern is adjacent to an open area. The substrate extends in a horizontal direction. A flowable CVD oxide film is formed to substantially fill the gaps in the dense pattern and over the substrate in the open area adjacent to the dense pattern. The flowable CVD oxide film has a top surface in the open area adjacent to the dense pattern that is lower than the top surfaces of the lines and has a top surface within the lines to substantially fill the pattern to the top surfaces. The flowable CVD oxide film has a minimum thickness to fill the gaps in the dense pattern of lines and gaps. The flowable CVD oxide film slopes downward in a direction away from the dense pattern in the open area. A layer of silicon oxide is formed using PE-TEOS over the flowable CVD oxide film. The PE-TEOS is formed on the downward slope of the flowable CVD oxide film. The PE-TEOS layer of silicon oxide has compressive stress in the horizontal direction in the open area. The layer of silicon oxide has a lower surface outside of the dense pattern that is lower than the top surfaces of the lines. The flowable CVD oxide film is converted to silicon oxide after forming the PE-TEOS layer of silicon oxide. Converting the flowable CVD oxide film causes the silicon oxide formed from the flowable CVD film to have tensile stress in the horizontal direction in the open area. The compressive stress of the PE-TEOS layer of silicon oxide in the horizontal direction substantially balances the tensile stress of the silicon oxide formed from the flowable CVD film that is in the horizontal direction in the open area.

Inhibiting Wire Collapse

FIGS. 6B and 6C, which were previously discussed, depict example 3D memory arrays. Those Figures show a memory array region, but do not depict hookup regions for connecting the conductors 606, 608 to driver circuits that supply operating voltages and/or sense amplifiers that are used to sense a signal on conductor 606 and/or conductor 608. In one embodiment, there is a word line hookup region and a bit line hookup region outside of the memory array for such connections. Formation of conductive wires in the hookup regions can present problems, such as wire flaking.

9A is a diagram showing possible locations for BL hookup regions and WL hookup regions, in accordance with one embodiment. In this embodiment, there is a BL hookup region 902 on each side of the memory array 614 and a WL hookup region 904 on each side of the memory array 614. In one embodiment, the BL hookup region is only on one side of the memory array. In one embodiment, the WL hookup region is only on one side of the memory array. Note that a 3D memory device may have many memory arrays 614.

Figure 9A:
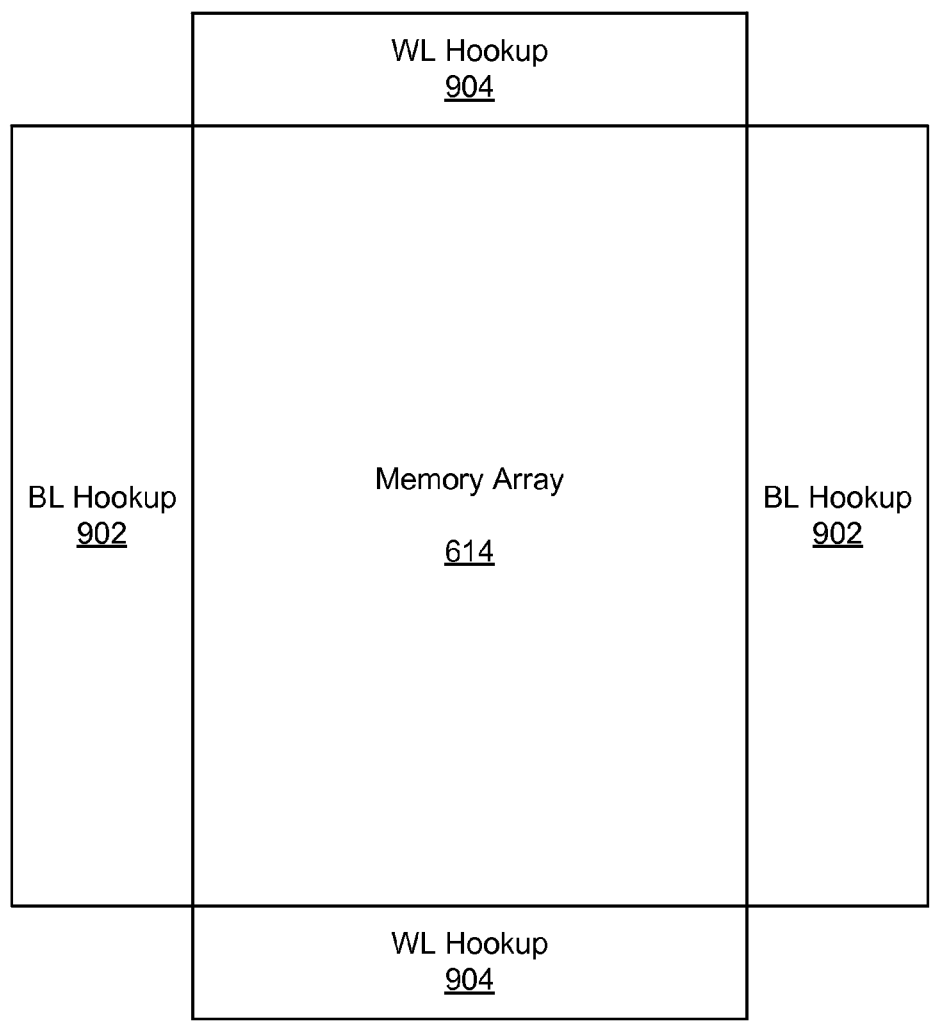
FIG. 9A is a diagram showing possible locations for BL hookup regions and WL hookup regions, in accordance with one embodiment.
Figure 9B:
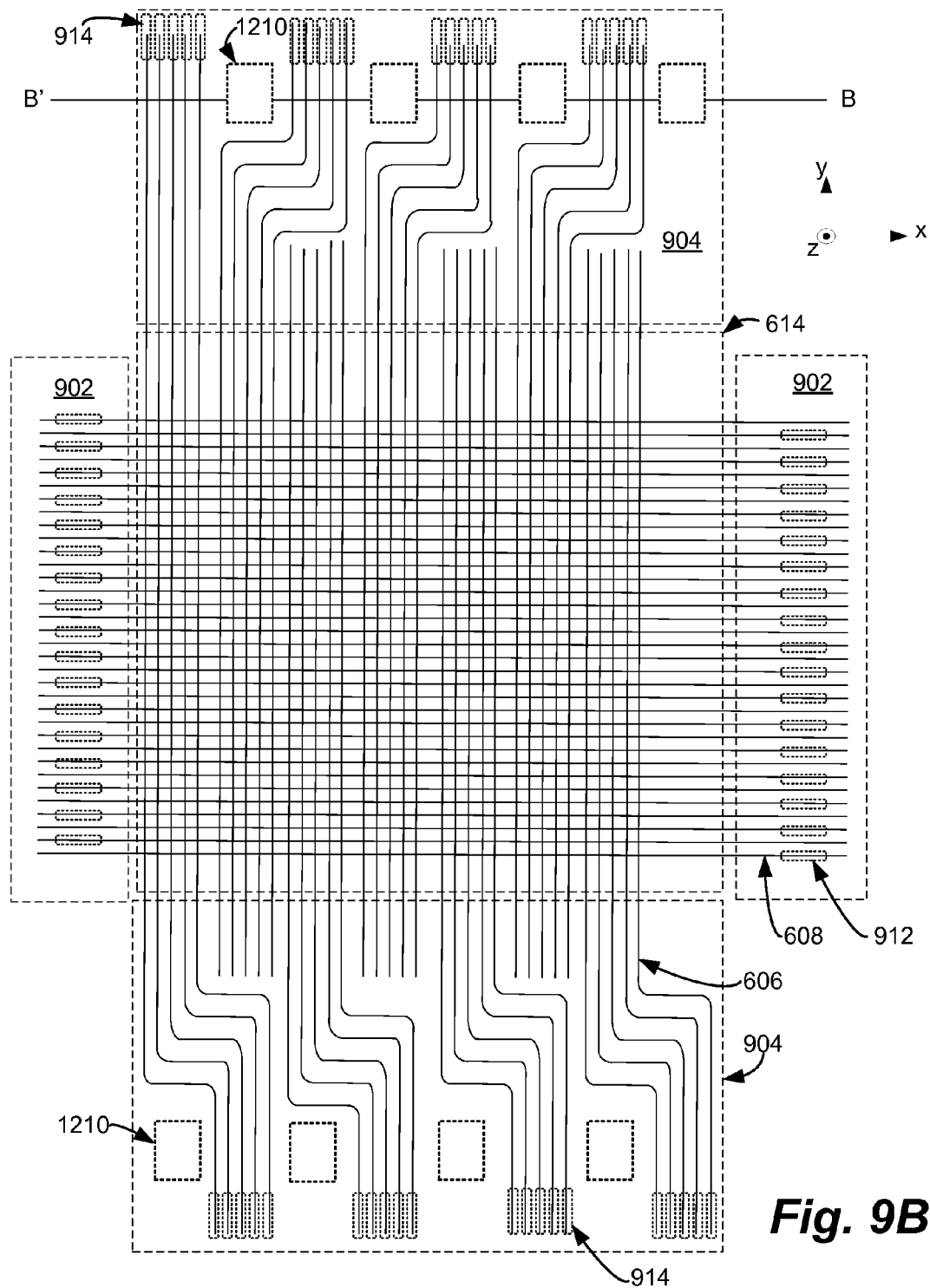
FIG. 9B is a diagram showing one possible configuration for bit lines and word lines, in accordance with one embodiment.

FIG. 9B is a diagram showing one possible configuration for bit lines 608 and word lines 606, in accordance with one embodiment. These could be the word lines 606 for one level of the 3D memory array 614, as well as the bit lines for one level of the 3D memory array 614. Each bit line 608 is electrically connected to a bit line contact 912, which in turn may be electrically connected to a zia (not depicted in FIG. 9B) to provide an electrical connection to a bit line driver. Each word line 606 is electrically connected to a word line contact 914, which in turn may be electrically connected to a zia to provide an electrical connection to a word line driver.

Note that for purpose of discussion the portion of a word line 606 that is located in a WL hookup region 904 may also be referred to as a "conductive wire" to distinguish it from the portion that is in the memory array 614. Likewise, for purpose of discussion the portion of a bit line 608 that is located in a BL hookup region 902 may also be referred to as a "conductive wire" to distinguish it from the portion that is in the memory array 614. The conductive wires may be formed from a highly conductive material, such as a metal. However, use of a metal is not required.

FIG. 9B also shows where CMP dummy structures 1210 may be located during formation of conductive wires in the WL hookup region 904. These CMP dummy structures 1210 help to prevent dishing during a CMP process. The CMP dummy structures 1210 may be removed and replaced by an insulator. Therefore, the CMP dummy structures 1210 are not part of the final 3D memory array, in one embodiment. CMP dummy structures 1210 may be used elsewhere in the WL hookup region 904 and in the BL hookup region 902.

FIG. 9B shows just one possible configuration. A more complex configuration may be used. The bit lines 608 are not necessarily straight lines in the y-direction when in the BL hookup region 902. Likewise, the word lines 606 can extend in more complex configurations when in the WL hookup region 904. The contacts 912, 914 can be located in other places. There may be more or fewer word lines 606 and bit lines 608. Note that with other configurations, CMP dummy structures 1210 may be used elsewhere in the WL hookup region 904 and in the BL hookup region 902.

Figure 9C:
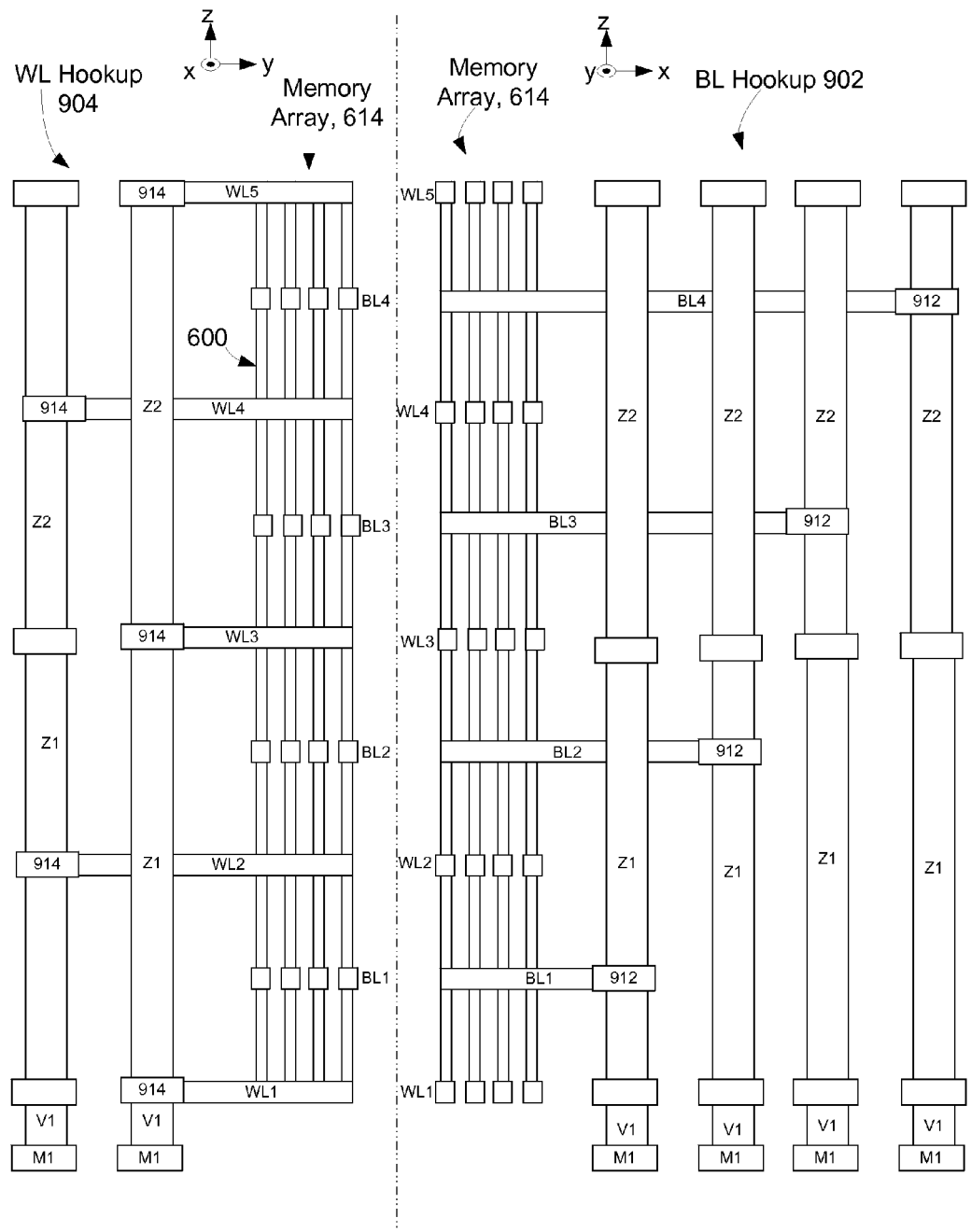
FIG. 9C depicts a schematic to illustrate one embodiment of a word line hookup region and a bit line hookup region.

FIG. 9C depicts a schematic to illustrate one embodiment of a word line hookup region and a bit line hookup region. The diagram shows the memory array 614 region from two perspectives. The memory array 614 on the left side depicts word lines extending in the y-direction. Bit lines are seen "on end"
in this perspective. The memory array 614 on the right side depicts bit lines extending in the x-direction. Word lines are seen on end in this perspective. Memory cells 600 are depicted between a word line and a bit line.

The zias are divided into two levels, referred to as Z1 and Z2. The bit line hookup region 902 has zias (Z1, Z2), which electrically connect the bit lines (BL1-BL4) to metal 1 layer (M1) by way of vias (V1). Electrical connections in M1 may connect to bit line drivers (not depicted in FIG. 9C). In this example, a bit line contact 912 provides an electrical connection between a bit line and one of the zias. The bit lines could also be connected to sense amplifiers through M1.

The word line hookup region 904 has zias (Z1, Z2), which electrically connect the word lines to metal 1 layer (M1) by way of vias (V1). Electrical connections in M1 may connect to word line drivers (not depicted in FIG. 9C). In this example, a word line contact 914 provides an electrical connection between a word line and one of the zias. In this example, odd word lines connect to one zia and even word lines connect to the other zia. The terms bit line and word line could be exchanged.

Figure 10A:
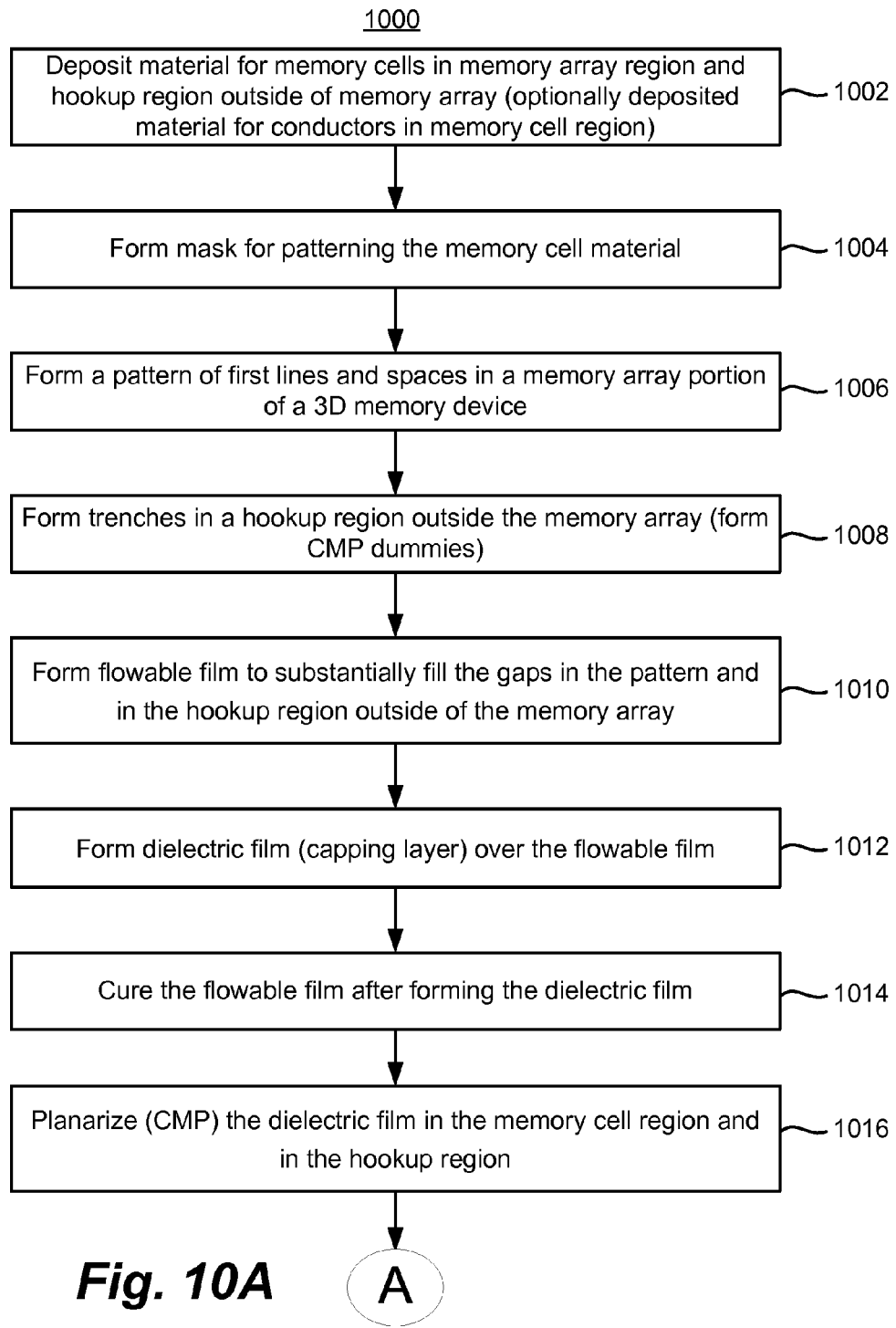
FIG. 10A and FIG. 10B illustrate a flowchart that described one embodiment of a process of forming a memory cell region and a hookup region.
Figure 10B:
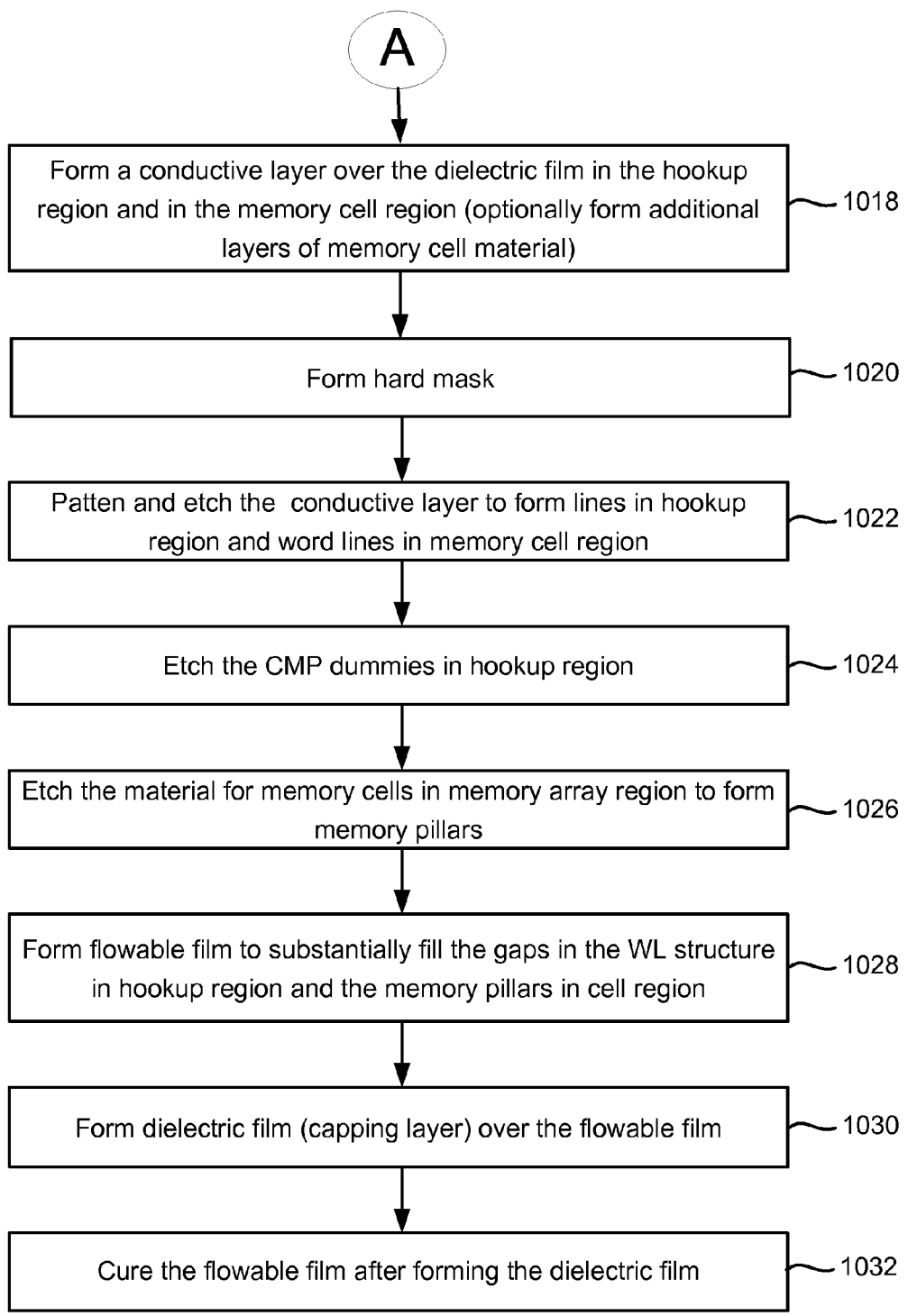

FIG. 10A and FIG. 10B illustrate a flowchart that described one embodiment of a process 1000 of forming portions of a memory cell region 614 and a hookup region 902, 904. The hookup region could be a bit line hookup region 902 or a word line hookup region 904. The process 1000 could be used to form a portion of the memory array (such as one level of memory cells). The process 1000 can be repeated to form additional levels. The process 1000 could be used to form a memory array 614 such as the examples depicted in FIGS. 6B and 6C.

The process 1000 may prevent or inhibit collapses of wires formed in the hookup region. The wires in the hookup region serve as an electrical connection between conductive lines (e.g., word lines or bit lines) in the memory array and drivers. The drivers could be located in a substrate below the 3D memory array, although location elsewhere is possible. FIGS. 11A-11F show formation of the memory cell region during the process of FIGS. 10A-10B. FIGS. 12A-12F show formation of conductive wires in a hookup region during the process of FIG. 10A-10B. The conductive wires in the in a hookup region may be extensions of word lines or bit lines from the memory array. In the example in FIGS. 12A-12F, the wire conductors being formed in the hookup region extend in the x-direction. Likewise, in the example in FIGS. 11A-11F, the conductors being formed in the memory cell region extend in the x-direction. Herein, such conductors have been referred to as bit lines. For the sake of discussion, the conductors being formed may be at the first bit line level (see "BL1" FIG. 9C). Note that the process can be used for other levels, including both bit lines and word lines. However, depicting formation of a lower level simplifies the drawings. Note that it is possible that various circuitry such as word line drivers and bit line drivers have already been formed.

Steps are depicted in a certain order, but could be performed in a different order. Also, some steps that are depicted as separate steps could be performed as a part of the same process step. For example, some process etches can etch in both the memory array and the hookup region. However, for convenience of illustration these may be depicted as separate steps.

In step 1002, material for memory cells 600 is deposited in a memory cell region and in a hookup region outside of the memory cell region. As discussed above, a memory cell 600 can have diode 604, bottom electrode 634, reversible resistivity-switching material 630, and top electrode 632. The diode 604 could be above or below the memory cell 600. As noted above, many different materials can be used to form the diode 604, electrodes 632, 634, and reversible resistivity-switching material 630. Other layers can also be deposited in step 1002. For example, metal can be deposited for a conductive line (such as a word line). In one embodiment, the metal for the conductive lines is deposited below the material for memory cells 600.

Figure 11A:
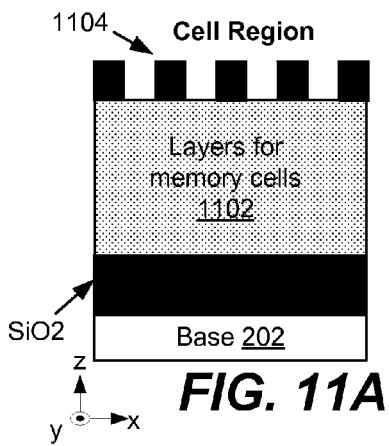
FIGS. 11A-11H show formation of the memory cell region during one embodiment of the process of FIGS. 10A-10B.
Figure 12A:
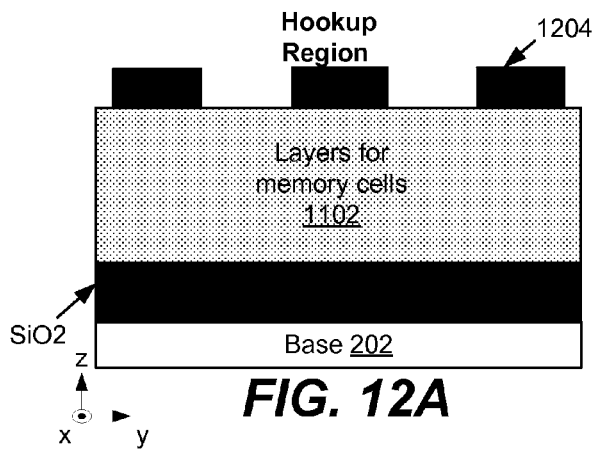
FIGS. 12A-12H show formation of conductive wires in a hookup region during one embodiment of the process of FIG. 10A-10B.

In step 1004, a mask is formed for pattering the memory cell material. FIGS. 11A and 12A depict results after step 1004. FIG. 11A shows memory cell material 1102 deposited over silicon oxide. For the sake of discussion, the memory cell material 1102 may include metal for the lower word line. The silicon oxide is over a base 202 (e.g., substrate). A mask 1104 has been formed over the memory cell material 1102. The cell region is depicted as a y-z slice in this perspective. Thus, the etch will form lines in the y-direction.

FIG. 12A shows formation in the hookup region after step 1004. The same material that is being used to form the memory cells has been deposited in the hookup region. The material will be used for CMP dummies, as will be explained later. A mask 1204 is formed over the memory cell material to be used to form the CMP dummies.

Next, the memory cell material may be etched in both the memory cell region and the hookup region. Step 1006 may include forming a pattern of lines and gaps in the memory cell region. This is for the initial formation of memory cell pillars. At this stage the memory cell material is still in lines that extend in either the x-direction or the y-direction depending on what level in the array is being formed.

Figure 11B:
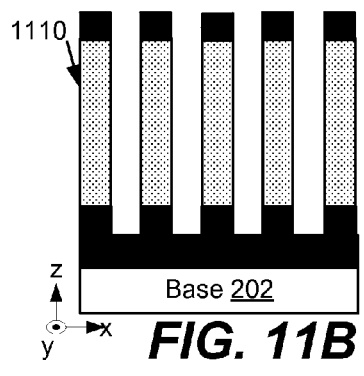

FIG. 11B shows results in the cell region after etching based on the mask 1104 from FIG. 11A. Lines 1110 of material that will be memory cells have been formed. The lines extend in the y-direction. This etch may also form lower word lines (e.g., WL1), as well as forming lines that will eventually be the memory cells just above WL1.

Figure 12B:
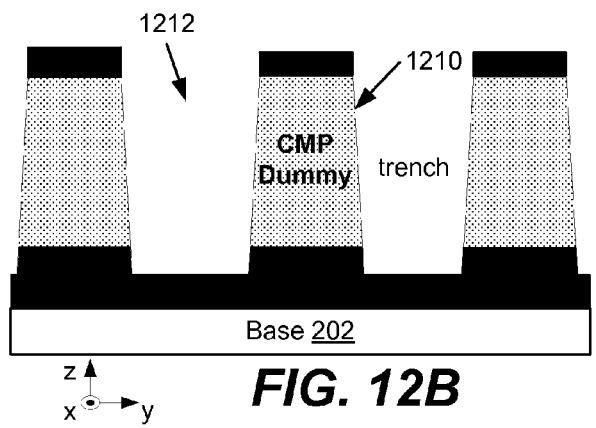

Step 1008 is etching in the hookup region to form trenches between CMP dummy structures. FIG. 12B shows formation in the hookup region after etching based on the mask 1204 of FIG. 12A. CMP dummy structures 1210 have been formed from the material that is being used to form memory cells in the memory cell region. The CMP dummy structures 1210 will help to prevent dishing during a later CMP. Trenches 1212 are between the CMP dummies 1210. In this example, the etching is performed in the x-direction. Etching could be performed in the y-direction instead of or in addition to the etching in the x-direction.

Step 1010 is to form a flowable film to substantially fill gaps in the pattern in the memory cell region and to partially fill the trenches in the hookup region. By substantially filling the gaps in the pattern in the memory cell region it is meant that there may be some voids where the flowable film does not completely fill the gaps. Also, it may be that the flowable film does not completely reach to the top of each gap.

In one embodiment, the flowable film leaves a gap in a given trench that is at least as wide as the pitch of the wires to be formed in and/or above the trench. Further details are discussed below.

In one embodiment, the flowable film is a flowable oxide film. This may be a flowable CVD oxide film. In one embodiment, the flowable film is a flowable spin on dielectric (SOD). In one embodiment, the flowable film is PSZ (polysilazane). The flowable film could be a different type of SOD. In one embodiment, the flowable film is carbon free. The composition of the flowable film may be $Si_xN_yH_z(O)$. In one embodiment, the flowable film does include carbon. For example, the composition of the flowable film may include silicon, oxygen, carbon, and hydrogen. A later step in the process may be used to cure the flowable film.

Step 1012 includes forming a capping layer over the flowable film. The capping layer may also be referred to as an insulating film. In one embodiment, the capping layer is formed from a flowable CVD oxide film. In one embodiment, the capping layer is formed using PE-CVD (Plasma Enhanced CVD). In one embodiment, the capping layer is a silicon oxide layer formed using PE-CVD. This may be referred to as a PE-TEOS silicon oxide layer. In one embodiment, the capping layer is a layer of silicon oxide formed using PE-CVD with tetraethylorthosilicate (TEOS) as a source. As one example, a silicon oxide PE-TEOS capping layer may be formed with a temperature over 300C, a pressure between 3-10 Torr, 13.56 MHz RF and 300-400 Hz LF plasma, and $O_2$ gas may be used as a oxidation gas. In one embodiment, the capping layer is a silicon nitride layer formed using PE-CVD. As one example, a silicon nitride PE-CVD capping layer may be formed with a temperature between 350-450 degrees C. and a pressure between 3-10 Torr. An RF power of more than 100W may be used. In one embodiment, the capping layer is a silicon oxide layer formed using HDP-CVD. As one example, a silicon oxide HDP-CVD capping layer may be formed with a temperature over 200 C and a pressure under 1 Torr. $SiH_4, O_2$ may be used. Ar, He or $H_2$ may be added to optimize the process. The foregoing process parameters are examples. The capping layer could be formed from other materials and/or using other processes. All process parameters could be higher or lower than those specified.

In step 1014, the flowable film is cured. In one embodiment, the flowable film is converted to silicon oxide. In one embodiment, step 1014 includes performing a high temperature steam anneal. For example, a flowable CVD oxide film that comprises $Si_xN_yH_z(O)$ may be converted to silicon oxide by performing a steam anneal. In one embodiment, step 1014 includes exposing the materials being formed to ultraviolet radiation. For example, the structure may be exposed to ultraviolet radiation, which may cure the flowable film. This may be used when the flowable film is a SOD, but is not so limited. Note the curing the flowable film could result in out-gassing. This out-gassing could cause flaking of wires to be formed in the hookup region. However, the capping layer may inhibit such flaking.

Figure 11C:
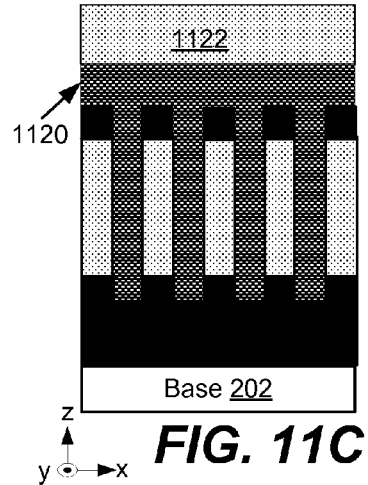

FIG. 11C depicts results in the memory cell region after step 1014. At this point the gaps in the memory cell region are substantially filled with a flowable oxide 1120 and a capping layer 1122 has been formed over the flowable oxide 1120. The capping layer may also be referred to as an insulating film.

Figure 12C:
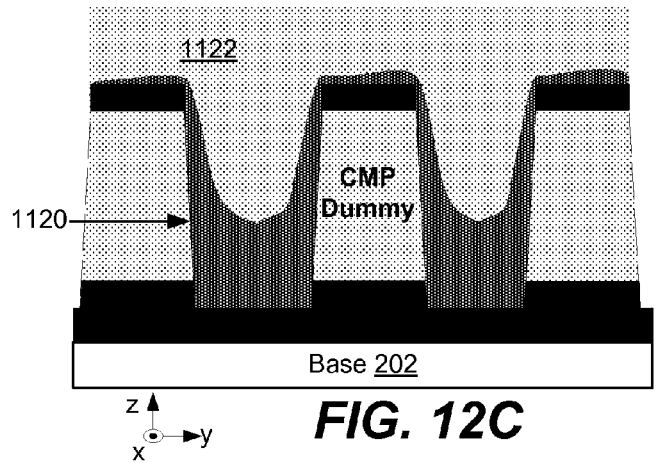
Figure 13A:
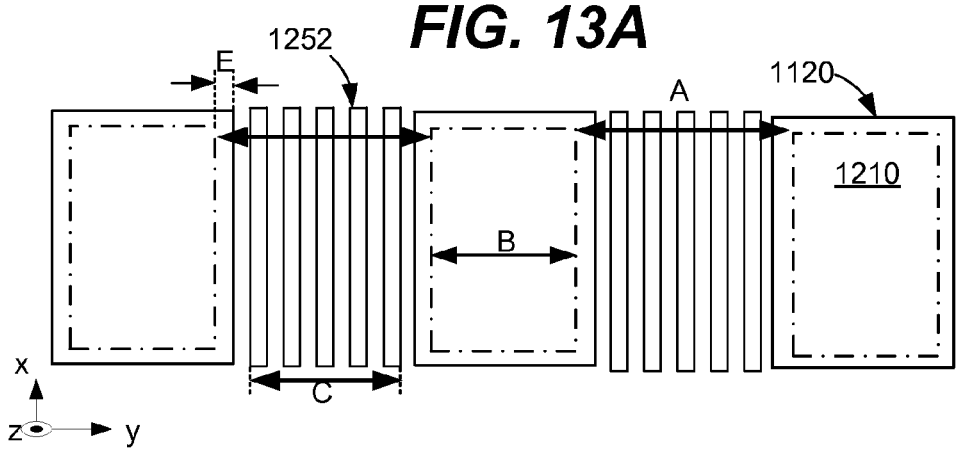
FIG. 13A depicts a top view of a hookup region to illustrate principles of embodiments disclosed herein.
Figure 13B:
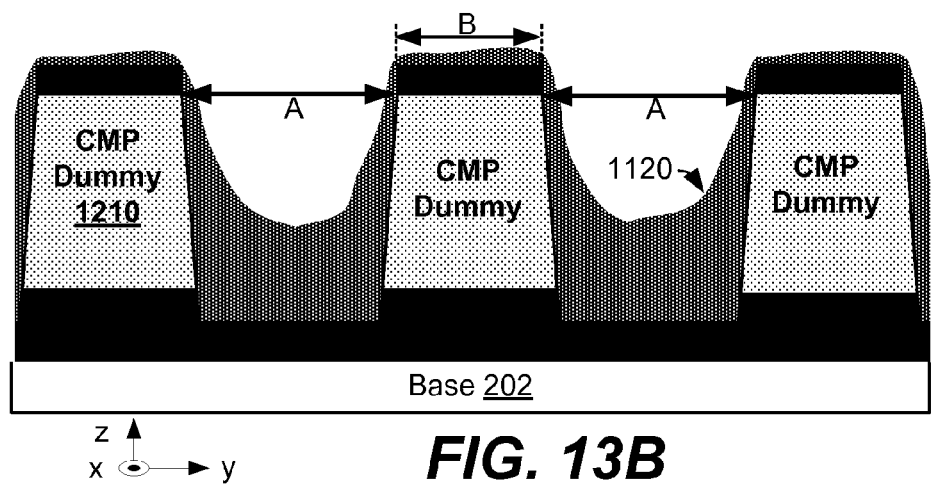
FIG. 13B depicts a side sectional view of a hookup region to illustrate principles of embodiments disclosed herein.
Figure 13C:
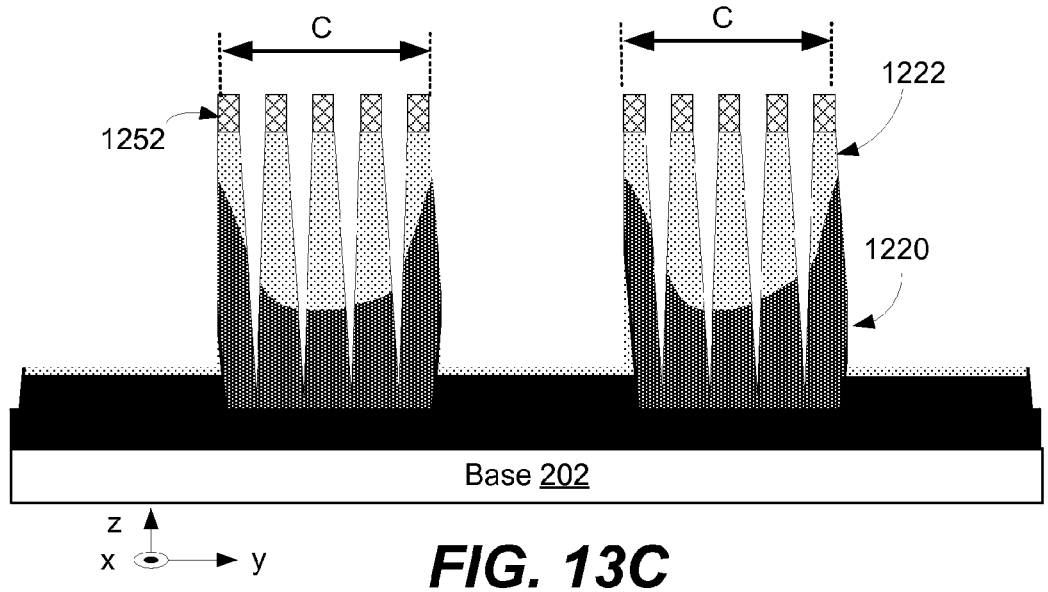
FIG. 13C depicts a side sectional view of a hookup region to illustrate principles of embodiments disclosed herein.

FIG. 12C depicts results in the hookup region after partially filling in the trenches between the CMP dummies with the flowable oxide and forming the capping layer over the flowable oxide 1120. FIGS. 13A-13C, to be discussed below, provide further details for details of partially filling in the trenches with the flowable oxide 1120.

Figure 11D:
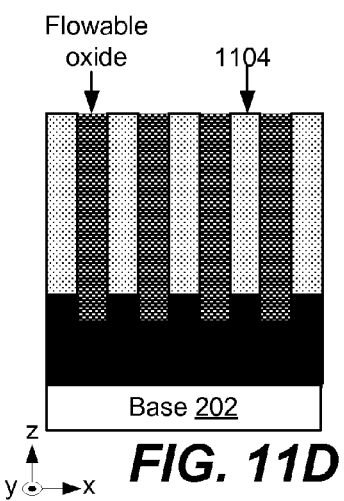
Figure 12D:
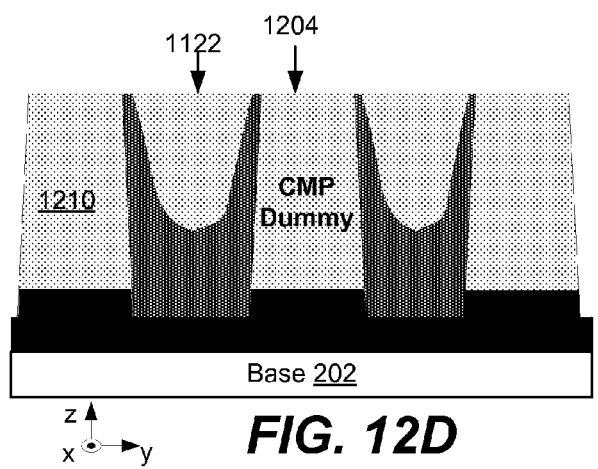

In step 1016, a CMP is performed to planarize the dielectric capping layer. The hard mask may also be removed. FIG. 11D depicts results in the memory cell region after performing the CMP. FIG. 12D depicts results in the hookup region after performing the CMP. The CMP dummies serve to prevent dishing in the WL hookup region. Portions of the capping layer 1122 remain to fill portions of the trench that are not filled by the flowable oxide 1120.

In step 1018, a conductive layer is formed over the dielectric film 1122 in the hookup region and in the memory cell region. In one embodiment, the conductive layer is tungsten.

However, a different conductive material could be used. The conductive material could be metal, but metal is not required. Optionally, another layer of memory cell material is deposited over the conductive layer.

Figure 11E:
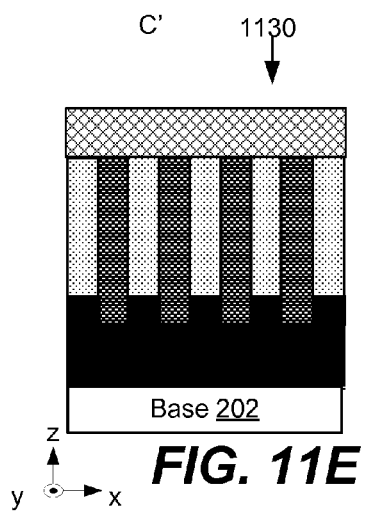
Figure 12E:
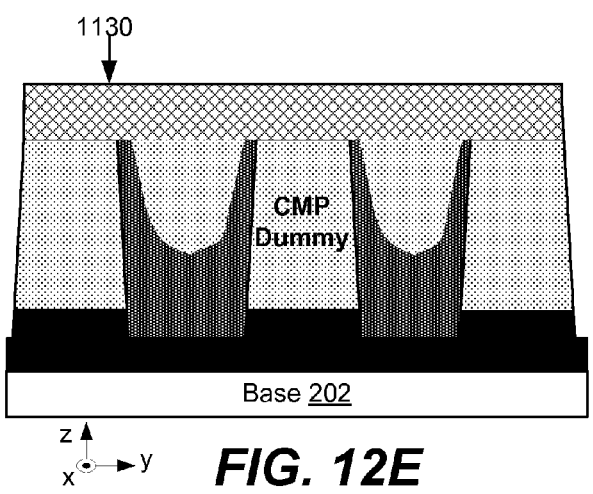

FIG. 11E depicts results in the memory cell region after depositing the conductive layer 1130. FIG. 12E depicts results in the hookup region after depositing the conductive layer 1130. As noted, another layer of memory cell material may be deposited over the conductive layer 1130. However, this is not depicted so as to simplify the discussion.

In step 1020, a hard mask is formed in the memory cell region and in the hookup region. The hard mask is formed in the memory cell region will be used to etch to form pillars. The hard mask is formed in the hookup region will be used to etch to form wires.

Figure 11F:
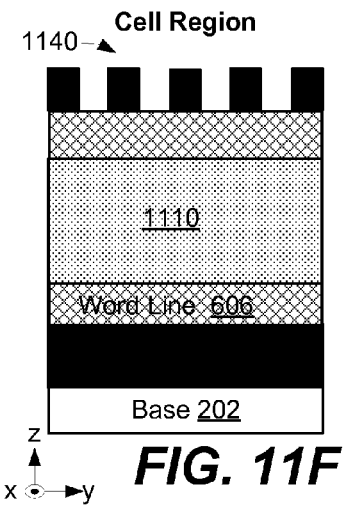
Figure 12F:
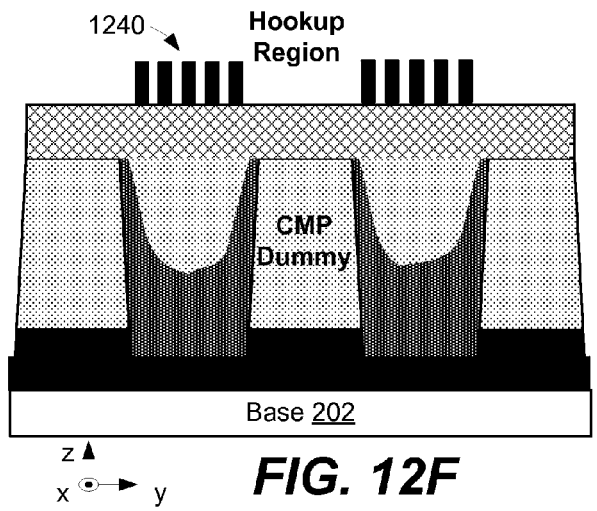

FIG. 11F depicts results in the memory cell region after forming a hard mask 1140 to be used to etch memory cell pillars. In FIG. 11F, the view is changed relative to the view of FIG. 11E. In FIG. 11F, a word line can be seen extending in the y-direction. FIG. 11F is a cross-section along line C-C' in FIG. 11E. The word line was depicted in FIG. 11E as being part of the memory cell material. In FIG. 11F, the word line is depicted as a separate layer of material below the memory cell material. Note that the memory cell material has been etched to form lines 1110. What is seen in FIG. 11F is one of the lines 1110 of memory cell material. FIG. 12F depicts results in the hookup region after forming a hard mask 1240 to be used to etch to form conductive wires.

In step 1022 the conductive layer 1130 is etched in the memory cell region and in the hookup region. Also, material below the conductive layer may also be etched. For example, material that is used to form memory cells may also be etched in the cell region in step 1026. This may form what will be referred to as "memory cell pillars." Also, that same material in the hookup region that serves as the CMP dummies may be removed in step 1024. Furthermore, the capping layer and the flowable oxide may be etched in the hookup region. Steps 1022-1026 are shown in this order as a matter of convenience of explanation. They may occur in a different order and/or at the same time.

Figure 11G:
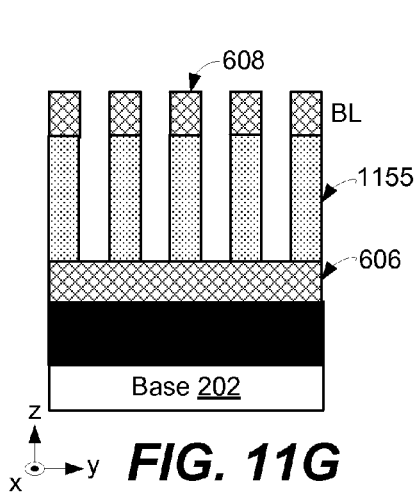

FIG. 11G depicts results in the memory cell region after step 1026. FIG. 11G shows the results of etching based on the hard mask 1140, after the hard mask has been removed. The result is memory pillars 1155 over a word line 606. Each memory pillar has a bit line 608 at its top. Referring back to FIG. 9C, the word line of FIG. 11G may correspond to WL1, the bit line to BL1 and the memory cells to the memory cells therebetween. Note that at this stage the memory cell material has been etched in both the x-direction and the y-direction to form "memory cell" pillars 1155.

Figure 12G:
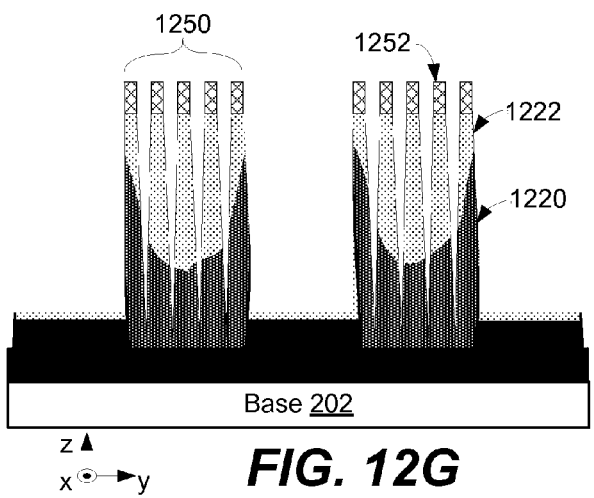

FIG. 12G depicts results in the hookup region after etching based on the hard mask 1240 (the hard mask has been removed). Hookup structures 1250 are formed. These hookup structures 1250 have conductive wires 1252 at the top. Each conductive wire 1252 is supported by a structure that includes remaining portions of the dielectric capping layer 1222. These portions may be lines that in this example extend in the x-direction. Note that in this embodiment, all of the wires 1252 are supported by a line 1222 that is the dielectric material, at least at the top just below the wire 1252. This may inhibit flaking or collapse of the wires 1252. If portion 1222 were not supporting a wire 1252 (and instead portion 1220 extending all the way up to wire 1252), then flaking may occur. For example, the structure below the wire 1252 could collapse. Thus, the dielectric material can inhibit flaking.

Portions of the flowable oxide 1220 have also been etched are and may be part of the structure that supports a wire 1252. However, as noted, a portion of the capping layer 1222 remains above the flowable oxide 1220. The CMP dummies have been removed as a result of the etch. The wires 1252 may be electrically connected to the bit lines or word lines in the memory cell region.

After the previous etching steps, insulating material may be deposited to fill gaps. In step 1028, flowable oxide is deposited. In step 1030, a dielectric capping layer is formed over the flowable oxide. In step 1032, the flowable oxide is cured. The materials used for the flowable oxide and capping layer may be similar to those used in steps 1010 and 1012.

Figure 11H:
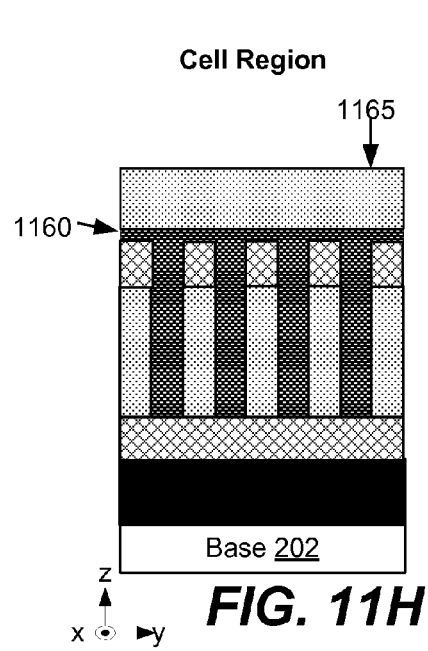

FIG. 11H depicts results in the memory cell region after filling in the gaps in the memory cell region with a flowable oxide 1160 and forming a capping layer 1165 over the flowable oxide. However, as noted above, an additional layer of memory cell material could be formed above the bit line layer prior to the last etch step. Steps 1026-1032 could be used to fill gaps in that level of memory cell material.

Figure 12H:
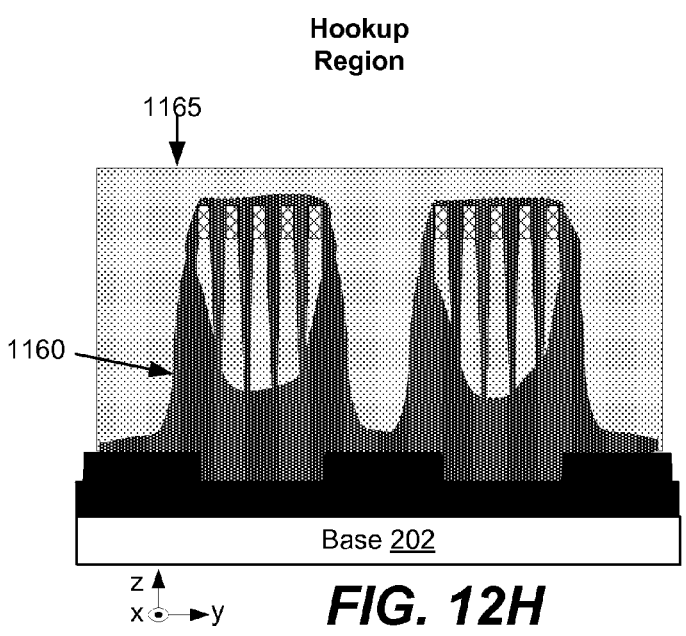

FIG. 12H depicts results in the hookup region after filling in the gaps in the structures 1250 with the flowable oxide 1160 and forming a capping layer 1165 over the flowable oxide. As noted herein, process 1000 could be used to form conductive wires in a word line hookup or a bit line hookup region. For ease of discussion, an example of formation in a bit line hookup region was discussed. However, the process 1000 could be used for formation of conductive wires in a word line hookup region. As one example, process 1000 could be used for formation of conductive lines along line B-B' in FIG. 9B. Note that several conductive lines are depicted between each CMP structure 1210.

Other steps may be used to form zias and to form contacts from the conductive wires in the hookup region to the zias. Such steps could be performed at various times during the process 1000.

FIGS. 13A-13C depicts several views of the hookup region to illustrate principles of formation of the flowable oxide, in accordance with one embodiment. FIGS. 13A-13C depict an example that is consistent with the discussion of FIGS. 12A-12F, which was an example for a bit line hookup region. However, principles also apply to a word line hookup region.

FIG. 13A depicts a top view of a hookup region to illustrate principles of embodiments disclosed herein. FIG. 13B depicts a side sectional view of a hookup region to illustrate principles of embodiments disclosed herein. FIG. 13C depicts a side sectional view of a hookup region to illustrate principles of embodiments disclosed herein.

Referring now to FIG. 13B, "A" represents the separation (e.g., width) between the CMP dummies 1210 in the y-direction at the top of the CMP dummies. That is, "A" is the trench width at the top of the CMP dummies 1210. "B" represents the width of the CMP dummies 1210 at the top of the CMP dummies 1210. "E" represents the thickness of the flowable oxide 1120 in the y-direction at the top of the CMP dummies 1210.

Referring now to FIG. 13C, "C" represents the total pitch of the wires 1252 that are formed over one of the trenches. In this example, five wires 1252 are depicted but there may be more or fewer than five wires.

Referring now to FIG. 13A, the dimensions "A", "B", "C" and "E" are illustrated from a top perspective. Elements in FIG. 13A correspond to various elements depicted in both FIGS. 13B and 13C. The inner box labeled 1210 represents the x-y footprint of the CMP dummy at its top. The outer box labeled 1120 represents the x-y footprint of the flowable oxide 1120 at the level of the top of the CMP dummies 1210. The five wires 1252 that are depicted correspond to the five wires 1252 shown in FIG. 13C. Note that the five wires 1252 actually extend further in the x-direction, but this is not shown so as to simplify the drawing.

In one embodiment, the flowable oxide 1120 fills the trenches in accordance with the following maximum fill width formula in Eq. 1.

$$E=(A-C-f)/2 \qquad \text{Eq. 1}$$

In Equation 1, f refers to the tolerance of the lithographic process used when forming the 3D memory array.

Thus, forming a flowable oxide film in accordance with the foregoing allows the capping layer to prevent wire flaking, in accordance with one embodiment.

One embodiment disclosed herein includes a method of forming features in a 3D memory array, which includes the following. A structure is formed having first lines and gaps in a memory cell region. Trenches are formed between dummy material in a hookup region outside of the memory cell region. A flowable film is formed in the memory cell region and in the hookup region. The flowable film substantially fills the gaps. The flowable film does not completely fill the trenches in the hookup region. An insulating film is formed over the flowable film in the memory cell region and in the hookup region. The insulating film fills remaining portions of the trenches that are not filled by the flowable film. A conductive region is formed over the insulating film that is in the trenches. The conductive region is etched in the hookup region to form conductive wires from the conductive region. The conductive wires for a given trench have a total pitch, the forming a flowable film in the hookup region leaves a gap in the given trench that is wider than the pitch of the wires.

One method includes a method of forming a 3D memory device, which comprises the following. Material is deposited in a memory cell region and in a hookup region outside of the memory cell region. The material in the memory cell region is etched to form lines and gaps. The material in the hookup region is etched to form trenches between CMP dummies formed from the material. A flowable film is formed using CVD in the memory cell region and in the hookup region. The flowable film substantially fills the gaps. The flowable film does not completely fill the trenches in the hookup region. A capping layer is formed over the flowable film in the memory cell region and in the hookup region. The capping layer fills remaining portions of the trenches not filled by the flowable film. The capping layer is planarized in the hookup region. The capping layer in the memory cell region is removed to expose the material for memory cells. A conductive region is formed over portions of the capping layer in the hookup region that are in the trenches and over the exposed material for memory cells in the memory cell region. The conductive region is etched in the hookup region to form conductive wires. The etching removes portions of the capping layer in the trenches to form insulating lines below the conductive wires. Each of the conductive wires is supported by an insulating line. The conductive region in the memory cell region is etched to form word lines or bit lines. The word lines or bit lines are electrically connected to the conductive wires. Zias are formed in the hookup region. The zias are electrically connected to the conductive wires. The zias are electrically coupled to drivers.

One method includes a method of forming a 3D memory device, which includes the following. Material for reversible resistivity memory cells is deposited in a memory cell region and in a hookup region outside of the memory cell region. The material in the memory cell region is etched to form lines and gaps. The material in the hookup region is etched to form trenches between CMP dummies formed from the material. A flowable film is deposited in the memory cell region and in the hookup region. The flowable film substantially fills the gaps. The flowable film does not completely fill the trenches in the hookup region. A capping layer is formed over the flowable film in the memory cell region and in the hookup region. The capping layer fills remaining portions of the trenches not filled by the flowable film. The capping layer is planarized in the hookup region. The capping layer is removed in the memory cell region to expose the material for memory cells. A conductive material is formed over portions of the capping layer in the hookup region that are in the trenches and over the exposed material for memory cells in the memory cell region. The conductive material is removed in the hookup region to form conductive wires, wherein the conductive wires for a given trench have a total pitch. Forming the flowable film in the hookup region leaves a space in a given trench that is at least as wide as the pitch of the conductive wires. The conductive material in the memory cell region to form conductive lines. The conductive lines are electrically connected to the conductive wires.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications to thereby enable others skilled in the art to best utilize the various embodiments and with various modifications as are suited to the particular use contemplated. It is intended that the scope be defined by the claims appended hereto.

What is claimed is:

1. A method of forming features in a 3D memory array, the method comprising:
    forming a structure having first lines and gaps in a memory cell region;
    forming trenches between dummy material in a hookup region outside of the memory cell region;
    forming a flowable film in the memory cell region and in the hookup region, the flowable film substantially fills the gaps, the flowable film does not completely fill the trenches in the hookup region;
    forming an insulating film over the flowable film in the memory cell region and in the hookup region, the insulating film filling remaining portions of the trenches that are not filled by the flowable film;
    forming a conductive region over the insulating film that is in the trenches; and
    etching the conductive region in the hookup region to form conductive wires from the conductive region, the conductive wires for a given trench have a total pitch, the forming a flowable film in the hookup region leaves a gap in the given trench that is wider than the pitch of the wires.

2. The method of claim 1, wherein the etching to form conductive wires removes portions of the insulating film in the trenches to form insulating lines below the conductive wires, each of the conductive wires is supported by an insulating line after the etching.

3. The method of claim 1, further comprising etching the material for memory cells in the memory cell region to form memory cell pillars while etching to remove the dummy material in the hookup region, the conductive wires are electrically connected to the memory cell pillars.

4. The method of claim 1, further comprising:
    planarizing the insulating film prior to forming the conductive region over the insulating film in the hookup region, the conductive region is formed in contact with portions of the insulating film that remain after planaraizing the insulating film.

5. The method of claim 1, further comprising:
depositing material for memory cells in the memory cell region and in the hookup region, the material for memory cells serves as the dummy material in the hookup region, the structure in the memory cell region is formed from the material for memory cells.

6. The method of claim 1, further comprising:
removing the insulating film in the memory cell region to expose the material for memory cells;
forming a conductive material over the exposed material for memory cells in the memory cell region; and
etching the conductive material in the memory cell region to form conductive lines, the conductive lines are electrically connected to the conductive wires.

7. The method of claim 1, wherein the forming a flowable film includes:
forming the flowable film using CVD (Chemical Vapor Deposition), or
forming a spin on dielectric (SOD) film.

8. The method of claim 1, wherein the forming an insulating film over the flowable film comprises one or more of:
forming a layer of silicon oxide using PE-CVD with tetra-ethylorthosilicate (TEOS) as a source;
forming a silicon nitride layer using PE-CVD;
forming a silicon oxide layer using PE-CVD; or
forming a silicon oxide layer using HDP-CVD.

9. The method of claim 1, further comprising:
curing the flowable film after forming the insulating film.

10. A method of forming a 3D memory device, the method comprising:
depositing material in a memory cell region and in a hookup region outside of the memory cell region;
etching the material in the memory cell region to form lines and gaps;
etching the material in the hookup region to form trenches between CMP dummies formed from the material;
forming a flowable film in the memory cell region and in the hookup region, the flowable film substantially fills the gaps, the flowable film does not completely fill the trenches in the hookup region;
forming a capping layer over the flowable film in the memory cell region and in the hookup region, the capping layer filling remaining portions of the trenches not filled by the flowable film;
curing the flowable film after forming the capping layer resulting in a dielectric;
planarizing the capping layer in the hookup region;
removing the capping layer in the memory cell region to expose the material for memory cells;
forming a conductive region over portions of the capping layer in the hookup region that are in the trenches and over the exposed material for memory cells in the memory cell region;
etching the conductive region in the hookup region to form conductive wires, the etching removes portions of the capping layer in the trenches to form insulating lines below the conductive wires, each of the conductive wires is supported by an insulating line;
etching the conductive region in the memory cell region to form word lines or bit lines, the word lines or bit lines are electrically connected to the conductive wires; and
forming zias in the hookup region, the zias are electrically connected to the conductive wires, the zias are electrically coupled to drivers.

11. The method of claim 10, wherein the conductive wires for a given trench have a total pitch, the forming a flowable film in the hookup region leaves a gap in the given trench that is at least as wide as the pitch of the wires.

12. The method of claim 10, wherein the conductive wires associated with a given trench have a total pitch "C", the given trench having a width "A" at a top of the CMP dummies, the flowable film having a maximum thickness "E" at the top of the CMP dummies, wherein E is less than (A−C)/2.

13. The method of claim 12, wherein E=(A−C−f)/2, f is a tolerance of a lithographic process used to form the 3D memory device.

14. The method of claim 10, wherein the forming a capping layer over the flowable film comprises one or more of:
forming a layer of silicon oxide using PE-CVD with tetra-ethylorthosilicate (TEOS) as a source;
forming a silicon nitride layer using PE-CVD;
forming a silicon oxide layer using PE-CVD; or
forming a silicon oxide layer using HDP-CVD.

15. A method of forming a 3D memory device, the method comprising:
depositing material for reversible resistivity memory cells in a memory cell region and in a hookup region outside of the memory cell region;
etching the material in the memory cell region to form lines and gaps;
etching the material in the hookup region to form trenches between CMP dummies formed from the material;
depositing a flowable oxide film in the memory cell region and in the hookup region, the flowable oxide film substantially fills the gaps, the flowable oxide film does not completely fill the trenches in the hookup region;
forming a capping layer over the flowable oxide film in the memory cell region and in the hookup region, the capping layer filling remaining portions of the trenches not filled by the flowable oxide film;
planarizing the capping layer in the hookup region;
removing the capping layer in the memory cell region to expose the material for memory cells;
forming a conductive material over portions of the capping layer in the hookup region that are in the trenches and over the exposed material for memory cells in the memory cell region;
etching the conductive material in the hookup region to form conductive wires, wherein the conductive wires for a given trench have a total pitch, the forming a flowable oxide film in the hookup region leaves a space in the given trench that is at least as wide as the pitch of the conductive wires;
etching the conductive material in the memory cell region to form conductive lines, the conductive lines are electrically connected to the conductive wires.

16. The method of claim 15, further comprising:
etching the material for memory cells in the memory cell region to form memory cell pillars;
etching the material for memory cells in the hookup region to remove the CMP dummies; and
etching the capping layer in the trenches to form insulator lines below the conductive wires, each of the conductive wires is supported by an insulator line.

17. The method of claim 15, wherein a group of the conductive wires are formed over a first of the trenches, the group of the conductive wires having a total pitch of "C", the flowable film having a width at the top of the trench of "E", the trench having a width of "A", wherein E has a maximum of (A−C)/2.

18. The method of claim 15, wherein the conductive lines are either word lines or bit lines.

19. The method of claim 15, further comprising:
   curing the flowable oxide film after forming the capping layer.

20. The method of claim 15, further comprising:
   forming an insulator in gaps that result from etching of the conductive material in the hookup region.

* * * * *